US009589801B2

(12) United States Patent
Herbots et al.

(10) Patent No.: US 9,589,801 B2
(45) Date of Patent: Mar. 7, 2017

(54) METHODS FOR WAFER BONDING AND FOR NUCLEATING BONDING NANOPHASES USING WET AND STEAM PRESSURIZATION

(71) Applicants: Nicole Herbots, Tempe, AZ (US); Shawn Whaley, Chandler, AZ (US); Robert Culbertson, Tempe, AZ (US); Ross Bennett-Kennett, Gilbert, AZ (US); Ashlee Murphy, Scottsdale, AZ (US); Matthew Bade, Chandler, AZ (US); Sam Farmer, Tempe, AZ (US); Brance Hudzietz, Tempe, AZ (US)

(72) Inventors: Nicole Herbots, Tempe, AZ (US); Shawn Whaley, Chandler, AZ (US); Robert Culbertson, Tempe, AZ (US); Ross Bennett-Kennett, Gilbert, AZ (US); Ashlee Murphy, Scottsdale, AZ (US); Matthew Bade, Chandler, AZ (US); Sam Farmer, Tempe, AZ (US); Brance Hudzietz, Tempe, AZ (US)

(73) Assignee: Arizona Board Of Regents, A Body Corporated Of The State Of Arizona, Acting For And On Behalf Of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/238,979

(22) PCT Filed: Oct. 31, 2012

(86) PCT No.: PCT/US2012/062746
§ 371 (c)(1),
(2) Date: Feb. 14, 2014

(87) PCT Pub. No.: WO2013/066977
PCT Pub. Date: May 10, 2013

(65) Prior Publication Data
US 2014/0235031 A1    Aug. 21, 2014

Related U.S. Application Data

(60) Provisional application No. 61/553,461, filed on Oct. 31, 2011, provisional application No. 61/705,515, filed on Sep. 25, 2012.

(51) Int. Cl.
*H01L 21/18*    (2006.01)

(52) U.S. Cl.
CPC .................................. *H01L 21/187* (2013.01)

(58) Field of Classification Search
None
See application file for complete search history.

(56) References Cited

U.S. PATENT DOCUMENTS 4,871,416 A    10/1989  Fukuda
5,350,492 A     9/1994  Hall et al.
(Continued)

FOREIGN PATENT DOCUMENTS

JP    02145767    6/1990
JP    10-093122   4/1998
(Continued)

OTHER PUBLICATIONS

J. B. Lasky, "Wafer bonding for silicon-on-insulator technologies," 1986, Appl. Phys. Lett.,48(1), pp. 78-80.*
(Continued)

*Primary Examiner* — Kimberly Rizkallah
*Assistant Examiner* — Bo Bin Jang
(74) *Attorney, Agent, or Firm* — McDonnell Boehnen Hulbert & Berghoff LLP

(57) ABSTRACT

Substrates may be bonded according to a method comprising contacting a first bonding surface of a first substrate with a
(Continued)

second bonding surface of a second substrate to form an assembly in the presence of an steam atmosphere under suitable conditions to form a bonding layer between the first and second surfaces, wherein the first bonding surface comprises a polarized surface layer; the second bonding surface comprises a hydrophilic surface layer; the first and second bonding surfaces are different.

32 Claims, 9 Drawing Sheets

(56) References Cited

U.S. PATENT DOCUMENTS

| | | | |
|---|---|---|---|
| 5,938,209 A * | 8/1999 | Sirosh et al. | 277/622 |
| 6,023,082 A | 2/2000 | McKee et al. | |
| 6,228,175 B1 * | 5/2001 | Ridgeway et al. | 118/726 |
| 6,319,847 B1 | 11/2001 | Ishikawa et al. | |
| 6,323,108 B1 | 11/2001 | Kub et al. | |
| 6,511,876 B2 | 1/2003 | Buchanan et al. | |
| 6,613,677 B1 * | 9/2003 | Herbots et al. | 438/694 |
| 6,902,987 B1 | 6/2005 | Tong et al. | |
| 7,358,152 B2 | 4/2008 | Kub et al. | |
| 7,851,365 B1 | 12/2010 | Herbots et al. | |
| 2002/0123204 A1 | 9/2002 | Torvik et al. | |
| 2004/0229444 A1 * | 11/2004 | Couillard et al. | 438/455 |
| 2006/0154442 A1 | 7/2006 | De Souza et al. | |
| 2007/0161494 A1 | 7/2007 | Fukuyama et al. | |
| 2007/0166947 A1 | 7/2007 | Gadkaree et al. | |
| 2008/0014712 A1 | 1/2008 | Bourdelle et al. | |
| 2008/0280420 A1 | 11/2008 | Yamazaki et al. | |
| 2011/0129986 A1 | 6/2011 | Libralesso et al. | |
| 2012/0132263 A1 | 5/2012 | Herbots et al. | |

FOREIGN PATENT DOCUMENTS

| | | | |
|---|---|---|---|
| JP | 10-223878 | 8/1998 | |
| JP | 2006-140445 | 6/2006 | |
| KR | 10-0674708 | 1/2007 | |
| WO | 2009/150503 | 12/2009 | |
| WO | 2010/127320 | * 11/2010 | H01L 24/83 |

OTHER PUBLICATIONS

C. G. Armistead et al., "The Surface Hydroxylation of Silica," The Journal of Physical Chemistry, 1969, 73(11), pp. 3947-3953.*
V. Masteika et al., "A Review of Hydrophilic Silicon Wafer Bonding," 2014, ECS Journal of Solid State Science and Technology, 3 (4), pp. Q42-Q54.*
H. Kanabe, "Ge/Si Heterojunction Photodiodes by Wafer Bonding", Lasers and Electro-Optics Society, LEOS 2006, 19th annual meeting of the IEEE, pp. 863-864, 2006.
Shaw JM et al., "Atomic Displacement free interfaces and atomic registry in SiO2/(1×1) Si(100)", J. Apply. Phys. 100, 104109 (2006).
Herbots N. et al., "The Formation of ordered ultrathin SiO2/Si(100) interfaces grown on (1×1) Si(100)", Materials Science and Engineering B87, pp. 303-316 (2001).
Atluri et al., "Hydrogen passivation of Si(100) wafers as templates for low temperature (T<600 C) epitaxy", Nucl. Instrum. Methods Phys. Res. B, vol. 118, pp. 144-150 (1996).
Hearne et al., "Cgaracterizatuon of carbon in heteroepitaxial Si1-x-yGexCy thin films via combined ion channeling and nuclear resonance analysis", Nucl. Instrum. Methods Phys. Res. B, vol. 118, pp. 88-96 (1996).
Leavitt et al., Cross sections for 170.5 backscattering of 4He from Oxygen for 4He energies between 1.8 and 5.0MeV, Nucl. Instrum. Methods Phys. Res. vol. B44, pp. 260-265 (1990).
Munkholm et al., "Observatuon of a Distributed Epitaxial Oxide in Thermally Grown SiO2 on Si(001)", Phys. Rev Lett., vol. 75, No. 23, pp. 4254-4257 (1995).
Ourmazd et al., "Si—SiO2 Transformation: Interfacial Structure and Mechanism", vol. 59, No. 2, pp. 213-216 (1987).
Queeney et al., "Infrared spectroscopic analysis of an ordered Si/SiO2 interface", Appl. Phys. Lett., vol. 84, No. 4, pp. 493-495 (2004).
Wilk et al., "High-k gate dielectrics: Current status and materials properties considerations", J. Appl. Phys., vol. 89, No. 10, pp. 5243-5275 (2001).
Bradley, "A New Heteroepitaxial Silicon Dioxide Nanophase on OH-(1×1) Silicon (100) Identified via 3.05MeV ion channeling and the new 3-D mutlistring code", Ph.D. dissertation, Arizona State University, Tempe, AZ (2006).
Suni et al., Effects of Plasma Activation on Hydrophilic Bo9nding of Si and Si02, Jorunal of The Electrochemical Society, vol./Issue 149(6), pp. G348-G351 (2002).
Armistead et al.. The Surface Hydroxylation of Silica, JOuranl of PHyscial Chemistry, vol. 73, No. 11, pp. 3947-3953 (1969).
Lasky, Wafer Bonding for Silicon-on-Insulator Technologies, Applied Physics Letters, vol./Issue 48, 78, pp. 78-80 (1986).
Masteika et al., A Review of Hydrophilic Silicon Wafer Bonding, ECS Journal of Solid State Science and Technology, vol./Issue 3 (4), pp. 042-054 (2014).
Bal et al., Hydrophoobic to Hydrophilic Transition of HF-treated Si Surface During Langmuir-Blodgett Film Deposition, Chemical Physics Letters, vol./Issue 500, pp. 90-95 (201 0).
International Search Report for PCT/US2013/061722, mailed May 13, 2014.
International Search Report for PCT/US2012/62746, mailed Jan. 21, 2013.
International Search Report for PCT/US2010/033301, mailed Nov. 23, 2010.

* cited by examiner

METHODS FOR WAFER BONDING AND FOR NUCLEATING BONDING NANOPHASES USING WET AND STEAM PRESSURIZATION

RELATED APPLICATIONS

This application is a national stage application under 35 U.S.C. 371 of International Application No. PCT/US2012/062746, filed Oct. 31, 2012, which claims priority to U.S. Provisional Application Ser. No. 61/553,461 filed Oct. 31, 2011 and 61/705,515 filed Sep. 25, 2012, all of which are incorporated by reference herein in their entirety.

FIELD OF THE INVENTION

This invention relates to methods for bonding substrates, and in particular, bonding of semiconductor, semiconductor oxide and dielectric-coated wafers, and glasses, vitreous or fused, and including silica and silicate polymorphs.

BACKGROUND OF THE INVENTION

Previous methods for bonding wafers made of silicon and silicon oxide (including silica, fused or vitreous, glass, and silica and silicate polymorphs) usually require mechanical compression by direct physical contact at high temperatures. Additionally, achieving physical bonding strength above the intrinsic breakage point of the bondable materials typically requires deposition or plasma/sputtering/dry etching processing of the wafer bonds. The resulting bonds are susceptible to percolation in saline solutions, brittleness of the combined material and strain build-up from volume expansion. Shattering could occur from the 40% volume expansion and thermal mismatch between the Silica and Si(100) phases. Furthermore, desorption of any surface contaminants and/or adsorbates during processing at temperatures as low as 50° C. (at least above the dew point), can result in micro-pressure build-up, which can lead to shattering or delamination of bonded substrates.

The shape, size and contour of the devices and wafers determine the application and cost of the bonding technology. Many bonding technologies requires cumbersome and expensive dies and containers that were needed to be specifically designed and constructed in order to compress wafers which then limited production of volume and variety.

Since many biosensors, solar cells, and glass panel photovoltaic panels are typically based on silica wafers (including but not limited to borosilicate, alpha-quartz) and Si(100) wafers, there exists a need in the art for improved methods for bonding the same together. In particular, there exists a need for methods that can provide hermetically sealed devices, which may be implanted into the human body. Specifically, the need would be to improve the bonding temperature and pressure and the variety of materials to suit the requirements of biological implants.

SUMMARY OF THE INVENTION

Accordingly, in a first aspect, the invention provides methods for bonding substrates comprising contacting a first bonding surface of a first substrate with a second bonding surface of a second substrate to form an assembly in an atmosphere comprising steam and oxygen, under suitable conditions to form a bonding layer between the first and second surfaces; and optionally compressing the assembly wherein the first surface comprises a polarized surface layer; in one embodiment the second surface comprises a hydrophilic surface. However, in another embodiment, the first surface is not a polarized surface layer. The first and second surfaces are different.

In another aspect, the invention provides methods for bonding substrates comprising contacting a first bonding surface comprising $O_2H_2Si(1\times1)(100)$ of a first substrate comprising Si with a second bonding surface of a second substrate comprising a silicate to form an assembly in an atmosphere comprising steam and oxygen, under suitable conditions to form a bonding layer between the first and second bonding surfaces; and optionally compressing the assembly.

In another aspect, the invention provides methods for bonding substrates comprising contacting a first bonding surface comprising hydroxy-terminated silica of a first substrate comprising a silicate with a second bonding surface comprising $SiO_x$, where $0<x\leq 2.4$, of a second substrate comprising a silicate to form an assembly in an atmosphere comprising steam and oxygen, under suitable conditions to form a bonding layer between the first and second bonding surfaces; and optionally compressing the assembly.

In another aspect, the invention provided methods for bonding substrates comprising contacting a first bonding surface comprising an OH terminated surface of a first substrate comprising a group IV elemental or alloy or compound semiconductor substrate with a second bonding surface of a second substrate comprising a silicate or Group IV semiconductor or alloy oxide, to form an assembly in an atmosphere comprising steam and oxygen; under suitable conditions to form a bonding layer between the first and second bonding surfaces; and optionally compressing the assembly.

In a further embodiment that can be combined with any of the embodiments of the invention, the bonding conditions comprise application to the assembly of an electromagnetic field.

In a second aspect, the invention provides the bonded substrates formed according to the first aspect of the invention.

In a third aspect, the invention provides implantable medical devices comprising a bonded substrate of the second aspect of the invention.

In a fourth aspect, the invention provides solar cells comprising a bonded substrate of the second aspect of the invention, including encapsulated solar cells on glass panels.

In a fifth aspect, the invention provides atmospheric sensors and/or radio and wave emitters for marine and corrosive uses that are bonded to their power sources and emitters comprising a bonded substrate of the second aspect of the invention.

In a sixth aspect, the invention provides atmospheric sensors for 'smart' sand environmental, chemical and gas sensors bonded to their power sources and emitters comprising a bonded substrate of the second aspect of the invention.

In a seventh aspect, the invention provides remote research sensors with their own power sources and emitters comprising a bonded substrate of the second aspect of the invention.

In yet another embodiment, the invention provides a nanobonding phase that includes ordered $Si_2O_4H_4$ ($SiO_xH_y$) inorganic polymer chains that cross-bridge Si(100)/Si(111) and various $SiO_2$ phases. The nanobonding interphase can include hydrated $SiO_xH_y$ and hydroxylated $SiO_xH_y$.

DETAILED DESCRIPTION

Figure 1:
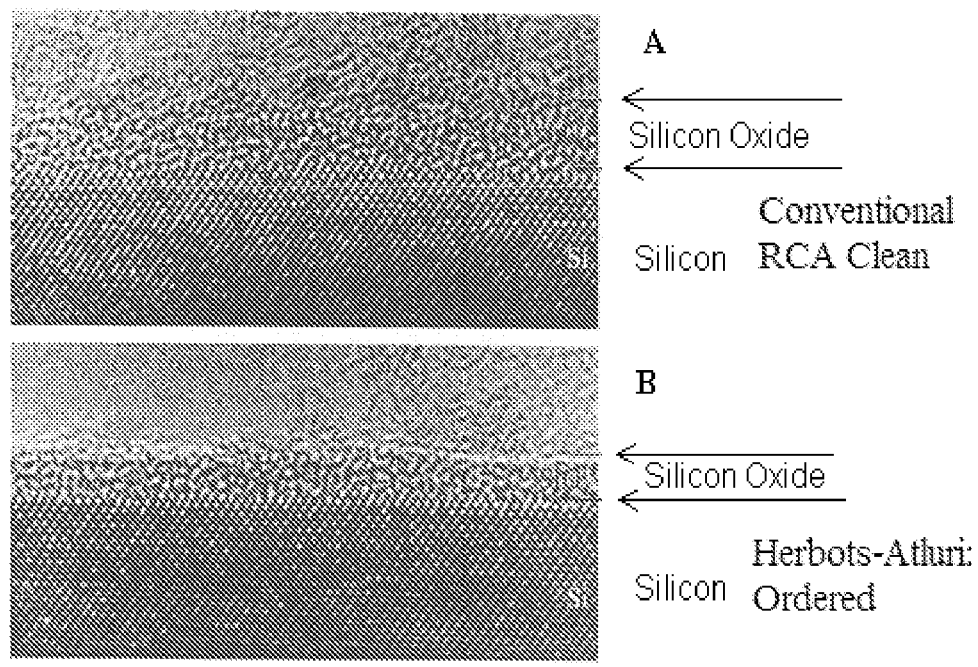
FIG. 1 shows high resolution transmission electron micrographs of $SiO_2$ formed on Si wafers, prepared using different cleaning techniques.

All references cited are herein incorporated by reference in their entirety. All embodiments disclosed herein can be combined with other embodiments unless the context clearly dictates otherwise.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number, respectively. Additionally, the words "herein," "above," and "below" and words of similar import, when used in this application, shall refer to this application as a whole and not to any particular portions of this application. As used herein, the singular forms "a", "an" and "the" include plural referents unless the context clearly dictates otherwise. "And" as used herein is interchangeably used with "or" unless expressly stated otherwise.

As used herein, the term "about" means within 5% of the recited limitation.

The description of embodiments of the disclosure is not intended to be exhaustive or to limit the disclosure to the precise form disclosed. While specific embodiments of, and examples for, the disclosure are described herein for illustrative purposes, various equivalent modifications are possible within the scope of the disclosure, as those skilled in the relevant art will recognize. For example, while method steps or functions are presented in a given order, alternative embodiments may perform functions in a different order, or functions may be performed substantially concurrently. The teachings of the disclosure provided herein can be applied to other procedures or methods as appropriate. The various embodiments described herein can be combined to provide further embodiments.

In a first aspect, the present invention provides methods for bonding substrates comprising (a) contacting a first bonding surface of a first substrate with a second bonding surface of a second substrate to form an assembly in an atmosphere comprising steam and oxygen, under suitable conditions to form a bonding layer between the first surface and the second surface; and (b) optionally compressing the assembly, wherein the first bonding surface comprises a polarized surface layer;

the second bonding surface comprises a hydrophilic surface layer; and the first bonding surface and the second bonding surface are different.

The Substrates

Substrates suitable for use in the invention can comprise any group IV element and IV, IV-IV, and IV-IV-IV multi-element semiconductor substrate, including but not limited to Si, Ge, $Si_xGe_{1-x}Si_{1-x-y}$, $Ge_xC_y$, $Si_{1-x-y}Ge_xSn_y$, $Si_{1-x-y-z}Ge_xSn_yC_z$, $Ge_xC_{1-x}$. In one embodiment the substrates can comprise any polymorphic phase of the preceding as well as any oxide, nitride, oxynitride, carbide, oxycarbide, oxynitrocarbide, and hydride of the preceding Group IV semiconductor substrates and alloys. For example, the substrates can comprise an oxide of Si, Ge, $Si_xGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another example, the substrates can comprise a nitride of Si, Ge, $Si_xGe_{1-x}$, $Si_{1-x-y}Ge_xC_y$, $Si_{1-x-y}Ge_xSn_y$, $Si_{1-x-y}Ge_xSn_yC_z$, or $Ge_xC_{1-x}$. In another example, the substrates can comprise an oxynitride of Si, Ge, $SixGe_{1-x}$, $Si_{1-x-y}Ge_xC_y$, $Si_{1-x-y}Ge_xSn_y$, $Si_{1-x-y-z}Ge_xSn_yC_z$, or $Ge_xC_{1-x}$. In another example, the substrates can comprise a hydride of Si, Ge, $Si_xGe_{1-x}$, $Si_{1-x-y}Ge_xC_y$, $Si_{1-x-y}Ge_xSn_y$, $Si_{1-x-y}Ge_xSn_yC_z$, or $Ge_xC_{1-x}$. In one embodiment, the first substrate can comprise any of the preceding embodiments. In another embodiment, the second substrate can comprise any of the preceding embodiments.

The substrates can also comprise any of the preceding group IV element and IV, IV-IV, and IV-IV-IV multi-element semiconductor substrates comprising a hydroxylated surface. The substrates can also comprise any of the preceding group IV element and IV, IV-IV, and IV-IV-IV multi-element semiconductor substrates comprising a hydride-terminated surface. Further, the substrates can also comprise any polymorphic phase of the preceding as well as any oxide, nitride, oxynitride, carbide, oxycarbide, oxynitrocarbide, and hydride of the preceding Group IV semiconductor substrates and alloys comprising a hydroxylated surface. In one embodiment, the first substrate can comprise any of the preceding embodiments. In another embodiment, the second substrate can comprise any of the preceding embodiments.

Group IV element and multi-element substrates can be doped, for example, with Group III dopants such as B, Ga, Al, or In and/or Group V dopants such as N, P, As, or Sb and or Group IV dopants such as Ge, Sn, or C; and/or Group VI dopants such as O, Se, or Te. Each can be independently doped at concentrations ranging from $10^{13}$ cm$^{-3}$ to $10^{22}$ cm$^{-3}$.

For example, the substrates can comprise a material selected from the group consisting of Si, $Si_xGe_{1-x}$, $Si_{1-x-y}Ge_xC_y$, $Si_{3(1-x)}Ge_{3x}N_{4(1-\delta)}$, $Si_xGe_{(1-x)}(O_yN_{1-y})_n$, $Si_{1-x-y}Ge_xC_y(O_yN_{1-x})_n$, and $(Si_{1-x-y}Ge_xCO_3N_{4-x-y}$. In certain embodiments, the substrate comprises Si. Various crystal orientations of the above mentioned materials can be used, especially (100) and (111). In certain other embodiments, the substrate comprises Si(100). The substrate can also comprise oxidized Si(100). In one embodiment, the first substrate can comprise any of the preceding embodiments. In another embodiment, the second substrate can comprise any of the preceding embodiments.

Other substrates suitable for use in the invention can comprise semiconductor oxide substrates including oxides of all group IV element and IV, IV-IV, and IV-IV-IV multi-element substances, including but not limited to $SiO_2$, $GeO_2$, $Si_xGe_{1-x}O_2$, $Si_{1-x-y}Ge_xC_yO_2$, and $Ge_xC_{1-x}O_2$. Nitride-containing semiconductors can comprise $Si_3N_4$ or $Si_{3(1-x)}Ge_{3x}N_{4(1-\delta)}$ as substrates. Dielectrics on silicon and other group IV, IV-IV, and IV-IV-IV materials such as nitrides and oxynitrides can benefit from this method. These materials are both stable with respect to the solutions employed and can form a passivating hydrogen-based layer when exposed to a hydrogen source. They are also capable etching by hydrofluoric acid (HF). In certain embodiments, a substrate comprises $SiO_x$, where $0<x \leq 2.4$. In another embodiment, a substrate comprises $SiO_x$, where $0<x \leq 2.4$. In another embodiment, a substrate comprises $SiO_2$. Substrates comprising $SiO_2$ include, but are not limited to, substrates comprising silicate polymorphs (amorphous, polycrystalline, or crystalline) such as thermal $SiO_2$ grown on Si, α-quartz, beta-quartz, beta-c, borosilicate wafers, alpha-cristobalite, beta-cristobalite, coesite, tridymite, amorphous silica, and the like. In one embodiment, the first substrate can comprise any of the preceding embodiments. In another embodiment, the second substrate can comprise any of the preceding embodiments.

The substrates can comprise Silicon Carbide (SiC) in its various polymorphic crystalline or amorphous phases.

In another embodiment suitable substrates include a metal or semiconductor first substrate (or first surface), and its oxide as the second substrate (or surface). Thus, a first substrate comprising an Al or an Al surface can be bonded with a second substrate comprising $Al_2O_3$ or an $Al_2O_3$ surface. In other examples, the second substrate can comprise $TiO_2$, or any oxide, nitride, oxynitride, carbide, oxycarbide, and oxynitrocarbide of Ti, TiW, Nb, Ta, Zr, Er, or La. In another embodiment, the second substrate can comprise a perovskite compound used in refractory MOS gates.

In one embodiment, the first substrate can comprise any of the preceding embodiments. In another embodiment, the second substrate can comprise any of the preceding embodiments.

In one embodiment, the first and second substrates each independently comprise (i) an optionally doped group IV element, or an optionally doped IV-IV or an optionally doped IV-IV-IV multi-element semiconductor; (ii) a polymorphic phase, oxide, nitride, oxynitride, carbide, oxycarbide, oxynitrocarbide, or hydride of an optionally doped group IV element, or an optionally doped IV-IV or an optionally doped IV-IV-IV multi-element semiconductor; or (iii) Al, $Al_2O_3$, Ti, $TiO_2$, any oxide, nitride, oxynitride, carbide, oxycarbide, and oxynitrocarbide of Ti, TiW, Nb, Ta, Zr, Er, or La, or mixtures thereof, or a perovskite compound used in refractory MOS gates, wherein any of (i)-(iii), each has an optionally hydroxylated or hydride-terminated surface. In one embodiment, the first substrate can comprise any of the preceding embodiments. In another embodiment, the second substrate can comprise any of the preceding embodiments.

In another embodiment, the first and second substrates each independently comprises Si, Ge, $Si_xGe_{1-x}$, $Si_{1-x-y}Ge_xC_y$, $Si_{1-x-y}Ge_xSn_y$, $Si_{1-x-y}Ge_xSn_yC_z$, or $Ge_xC_{1-x}$. In another embodiment, the first and second substrates each independently comprises Si, $Si_xGe_{1-x}$, $Si_{1-x-y}Ge_xC_y$, $Si_{3(1-x)}Ge_{3x}N_{4(1-\delta)}$, Ge, $Si_xGe_{(1-x)}(O_yN_{1-y})_n$, $Si_{1-x-y}Ge_xC_y(O_yN_{1-x})_n$, or $(Si_{1-x-y}Ge_xC_y)_3N_{4-x-y}$, $SiO_2$, $GeO_2$, $Si_xGe_{1-x}O_2$, $Si_{1-x-y}Ge_xC_yO_2$, $Ge_xC_{1-x}O_2$, $Si_3N_4$ or $Si_{3(1-x)}Ge_{3x}N_{4(1-\delta)}$. In one embodiment, the first substrate can comprise any of the preceding embodiments.

In another embodiment, the second substrate can comprise any of the preceding embodiments.

In another embodiment, the first and/or second substrates can be vitreous or fused glasses, such as, but not limited to, silica and silicate polymorphs.

In other embodiments, substrates can be coated with tetraethyl orthosilicate (TEOS), where the TEOS may also act as a planarization layer, which wets the surface and enables the nucleation of a thicker bonding phase.

Another set of substrates comprise any Group III-V, and II-VI compounds including binaries, ternaries, and quaternary alloys thereof. The III-V compound semiconductors consist of at least one element selected from (In, Ga, Al, B) and at least one element selected from (N, P, As. Sb, Bi). For example, an example of a binary compound is GaAs. An example of a ternary compound is InGaAs. The II-VI compound semiconductors consist of at least one element selected from (Zn, Cd, Hg) and at least one element selected from (S, Se, Te).

Other wafer types that can serve as either first or second substrates are silicon on insulator (SOI), silicon on sapphire substrate and silicon on glass. The type of steam compression used in this invention is ideal for materials that would crack under mechanical compression as those found supra.

The substrates can be in the form of wafers or nanobeads comprising the materials noted above and having diameters ranging from about 10 nm to 5000 nm. In this case, the nanobeads inserted between the wafers can nucleate the bonding phase on the surface of the inserted beads. By this method, the beads provide an option for a more reactive surface to put into contact with particularly inert surfaces, or surfaces that for some reason cannot be planarized. In other embodiments of the invention, the substrates are substantially planar (i.e., wafers). When utilized, semiconductor substrates can have a polished surface, as known to those skilled in the art. The substrates can comprise any commercially available wafer, for example, having diameters ranging from 1-12 inches, although smaller and larger diameter wafers can be used, and non-circular wafers can also be used.

The substrates and substrate surfaces may be doped as necessary for the required purpose. However, dopants may segregate at the bonding surfaces at processing temperatures between approximately 125° C. and 1400° C., or at room temperature during native oxide formation which can snowplow dopants according to their solid solubility ratio between the oxide and the substrates. In particular, when Si or silicates, or generally any semiconductor are doped, the roughness of the bonding surface may increase due to dopant segregation, resulting in precipitates formed at the surfaces. In certain embodiments, when the surfaces being bonded are doped (for example, with dopants such as B, P, As, Sb, or any other dopant used in Si; and/or dopants including but not limited to Ga, Al, Te, In, Sn, C, for $SiO_2$ polymorphs, each at doping concentrations ranging from $10^{13}$ cm$^{-3}$ to $10^{22}$ CM$^{-3}$ the segregation peaks should be removed to promote better nucleation of the bonding interphase. As discussed in Herbots' PhD thesis ((1984), JES, (1984), NIMB (1986), O. C. Hellman MRS proceedings (1988), D. C. Eng (JEM, 1989-1990)), the solute traps dopants so that they become "stuck." After the annealing of the solutes, the dopants "fall out" of solution.

When the surfaces to be bonded comprise amorphous thermal oxide, the bonding phase is able to follow the contours of the wafer topography (e.g., Si wafer) upon which the amorphous thermal oxide was grown. However, to promote continuity of the bonding phase and ensure cohesion of the macroscopic bonding over large wafer areas, non-amorphous surfaces can be optically or electronic grade polished to reduce any atomic steps or terraces present. The polish can enable preparation of a surface having a root mean square (r.m.s) roughness of at least 2 nm or less, for example, about 0.2 nm.

Substrate Surface Preparation

Generally, the substrates can be prepared for bonding by providing a chemical template in the form of a polarized surface as a first bonding surface of a first substrate, for example, a surface prepared by the Herbots-Atluri method on Si(100) or on a crystalline quartz $SiO_2$ and providing a highly reactive, hydrophilic surface as the second bonding surface of a second substrate.

A non-polarized (assumed first) surface such as one prepared by a purely aqueous version of Herbots-Atluri is also possible given that the wet oxidation will provide the catalysts and charged radicals necessary to promote the nanobonding reaction to cross-bridge the two surfaces with a wet oxide nano-phase. The wet oxidation will be subsequently described. The first and second bonding layers can be nucleated via initial Langmuir-Blodgett (LB) films on the surfaces (and precursor phase) to be bonded, using wet chemical processing as described below. The processing can involve two different sequences of repeated etching and oxidation ending in the final surface termination step to create two different LB films on the two substrates for bonding. The two different LB films created, one on each of the two surfaces to be bonded, are initial nanophases that initiate the chemical reaction leading to the bonding layer (i.e., a cross-bridging interphase) that bonds the two surfaces.

Hydrophilic surfaces can be provided to at least the first bonding surface of the first substrate by cleaning a surface or the first substrate according to methods known in the art for cleaning semiconductor surfaces. For example, appropriate cleaning methods include, but are not limited to one or more of: SC1 Clean ($H_2O+NH_4OH+H_2O_2$), SC2 Clean ($H_2O+HCl+H_2O_2$), RCA Clean (SC1, then SC2), Piranha Strip ($H_2SO_4+H_2O_2$), Nitride Strip ($H_3PO_4$), Oxide Strip ($HF+H_2O$), Dry Strip ($N_2O$, $O_2$, $CF_4+O_2$, or $O_3$), or the Herbots-Atluri clean. In certain embodiments, the substrate is cleaned, at least, according to the Herbots-Atluri clean, and the Herbots-Atluri clean is the last cleaning step performed. As has been described in U.S. Pat. No. 6,613,677, when a semiconductor substrate is cleaned according the Herbots-Atluri clean, an ordered passivating layer of oxygen and hydrogen is formed on the semiconductor substrate surface. Methods for preparing semiconductor substrates and interfacial oxides thereon, and in particular beta-cristobalite oxides, are also described in U.S. Pat. No. 7,851,365 (incorporated herein by reference). Tetragonal distortion of the ordered or epitaxial beta-cristobalite oxide surface (to match the in-plane lattice constant of the underlying substrate) causes the oxygen atoms to move closer to each other along the surface, and their mutual repulsion is shielded by the hydrogen atoms between them. In this arrangement, the charges are not free to move, they do not readily respond to the dipole moment of water molecules. Thus the layer is hydrophobic.

The atomic and charge arrangements for a polarized, hydrophobic phase of tetragonally distorted beta-cristobalite-like $SiO_2$ shows that the tetragonally distortion of beta-cristobalite-like $SiO_2$ conserves volume ($V=A^3=(0.72$ nm$\pm 0.2)^3=0.37$ nm$^3$). The 0.72 nm square base of the cubic beta-cristobalite-like cell is contracted to match the 0.54 nm base of the Si(1 00) cubic cell while the height expands to 1.24 nm to conserve volume ($B=V/(A_{Si})_2=1.28$ nm; $A_{Si}=0.54$ nm). Once the atoms have reached their location in the geometrically distorted structure, the electronegative oxygen atoms have to move closer along the surface, and their mutual repulsion is shielded by hydrogen atoms between them, allowing for the formation of an alternating distribution of dipoles. FIG. 1 shows scanning electron micrographs of silicon oxide films formed on Si. FIG. 1A shows the surface for a conventional RCA clean. The oxide film on the unplanarized surface exhibits 2±0.2 nm in average thickness due to surface height fluctuation caused by atomic steps every approximately 0.2-2.0 nm, of a 10 nm length scale. The first part of the Herbots-Atluri clean reduces the step density and extends the atomic terraces to widths between approximately 2 nm and 20 nm, and in some embodiments, greater than 20 nm, thereby flattening the surface on that length scale to create regions of contacts for bonding. In comparison with the RCA clean, the Herbots-Atluri clean provides an oxide on the planarized surface with 1.6 nm average thickness, and with less variation (FIG. 1B).

In certain examples, a polarized substrate surface is provided by a cleaning process comprising a deionized (DI) water wash, SC1 clean, DI rinse, $H_2O$/HF etch, DI rinse, SC2 clean, DI rinse, HF/MeOH etch, and a rinse with DI water or alcohol (methanol). In such processes the temperature of the chemical baths and rinses can be about 80° C. or slightly below, in order to achieve increased uniformity and minimize drying times prior to contact (infra).

The ultimate uniformity, hermeticity (i.e., water-resistance), and strength of bonding of the first bonding layer can be controlled by a specific range of chemical concentrations in preceding cleaning steps, such as, the SC1 and SC2 solutions used in the sequence of chemical steps to grow the nucleation-initiating LB films. In particular, maintaining the SC2 solution close to a 5:1:1 ratio ($H_2O$:HCl:$H_2O_2$) to grow a chemical oxide for etching by HF in either water ($H_2O$) or alcohol (e.g., methanol) can produce a uniform and essentially flat substrate surface. Ultimately, such control can yield a more dense and continuous first bonding layer upon contacting of the substrate surfaces.

Bonding strength and uniformity can also be increased by utilizing reagents of high purity, for example, 18 MΩ $H_2O_2$, Class 1 ppb $H_2O$, HCl, HF, and $NH_4OH$. These reagents are used to generate the 4:1:1 ($H_2O$:$H_2O_2$:$NH_4OH$) SC1, the 4:1:1 ($H_2O$:$H_2O_2$:HCl) SC2, the (99:1) $H_2O$:HF and the (95:5) Alcohol:HF where the alcohol can be methanol, ethanol, isopropanol, or mixtures thereof. In particular, reagents suitable for ultra-large scale integration (ULSI) have increased purity and particulate requirements and are readily available on the market.

Figure 2:
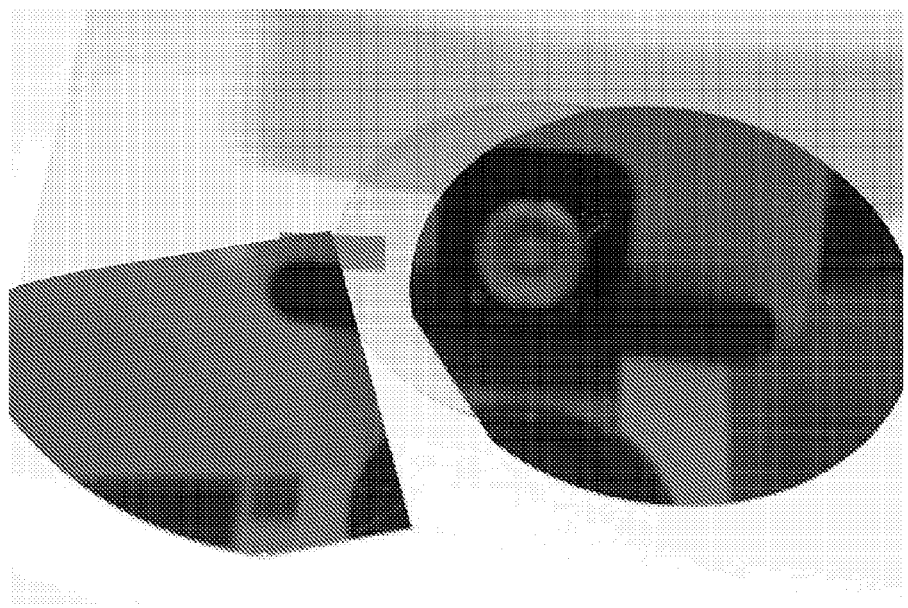
FIG. 2 is a photograph showing "As Received" silicon wafers.
Figure 3:
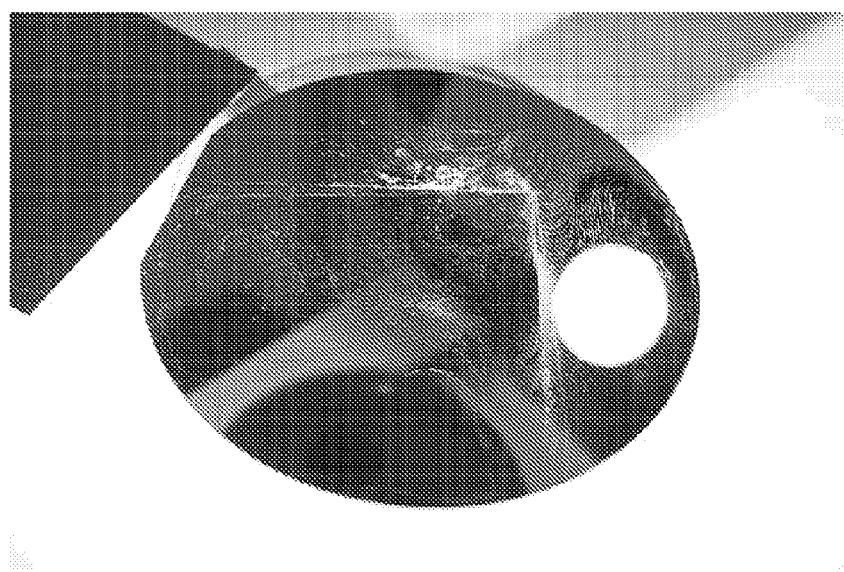
FIG. 3 is a photograph showing residue deposits on the wafers from FIG. 2, as a result of clogging of the hydrocarbon filter in the DI.

In an exemplary embodiment, the glass vessel (in which wafers are rinsed) is rinsed for a few minutes in running DI water (with a resistance preferably about 17.6-18 MegOhms), then cleaned with SC1 solution and $H_2O_2$, then rinsed & over-filled with clean running 18 MΩ water. In some embodiments, the vessel is rinsed for approximately 10 minutes. Clogging of the hydrocarbon filter in the DI system leads to residue that does not change the 17.6 MΩ maximum deionized resistivity, but still leaves contaminants union drying. FIG. 2 shows silicon wafers in "As Received" condition. FIG. 3 shows wafers with residues resulting from hydrocarbon-clogged filters.

The first bonding surfaces prepared as described above can be maintained in the static and inert atmosphere from the conclusion of the cleaning step until the bonding step. For example, the cleaned substrate is maintained in the static and inert atmosphere for about 30 seconds to 12 months; or about 30 seconds to 3 days; or about 30 seconds to 24 hours; or about 30 seconds to 30 minutes; or about 30 seconds to 5 minutes. The static and inert atmosphere can comprise a semiconductor-grade noble gas, nitrogen, or mixtures thereof. In other embodiments, the static and inert atmosphere can comprise semiconductor-grade nitrogen.

In some embodiments, in an intermediate processing step after cleaning, the substrates may be exposed to a static and inert atmosphere for a sufficient period of time to prevent the accumulation of organic impurities, which inhibit growth of the epitaxial phases of the invention. Such an exposure also serves to limit rearrangement of the freshly cleaned surface (particularly, when the substrates are cleaned by the Herbots-Atluri clean) due to impinging oxygen and moisture when the phase has just formed. Additionally, the exposure of the cleaned substrate to a static and inert atmosphere allows for an equilibrium to form between any remaining volatilizable surface-adsorbed molecules and the atmosphere. Desorption of these molecules in the inert atmosphere further cleans the substrate surface.

The cleaned substrates of the various aspects of the invention may be exposed to and/or stored in a static and inert atmosphere in a sealed container. For example, the sealed container can be a fluoropolymer or glass container, or aluminum bag. In other embodiments, the sealed container is a fluoropolymer or glass container, or aluminum bag that has been cleaned according to a semiconductor-grade cleaning process. In certain other embodiments, the sealed container is a fluoropolymer or glass container, or aluminum bag that has been cleaned according to a semiconductor-grade cleaning process comprising a peroxide solution (e.g., SC1, SC2, and/or the Herbots-Atluri clean). A plurality of such sealed containers may be stored in a secondary container which itself contains a static and inert atmosphere (supra), for example, a bag or box.

Hydrophilic surfaces can be provided to at least the second bonding surface of the second substrate by cleaning a surface of the second substrate. In certain embodiments, the second substrate comprises at least one silicate surface, which can be cleaned according to methods known in the art to generate a hydrophilic surface. For example, the second substrate can comprise an oxide surface grown on a semiconductor substrate, which has been cleaned as described above; such oxide surfaces can be, for example, thermally prepared according to methods known in the art. In other examples, a hydrophilic surface can be prepared on a semiconductor oxide substrate via cleaning comprising a chemical etching according to the methods described above for semiconductor substrates.

In certain examples, a hydrophilic substrate surface as the second bonding surface of the second substrate is provided via a cleaning process comprising a deionized (DI) water wash, SC1 clean, DI rinse, $H_2O$/HF etch, DI rinse, SC2 clean, DI rinse, HF/$H_2O$ etch, and a rinse with DI water. In such processes, the temperature and composition of the chemical baths can be maintained as described above to increase the ultimate uniformity, hermeticity and strength of bond formed by the second bonding layer of the second substrate.

In yet another embodiment, a standard wet chemical cleaning is used, with a final surface etching, for the purpose of disrupting surface bonds by overetching.

In yet another embodiment, a hydrophilic oxide is grown during cleaning, using, for example, wet thermal oxidation, or a wet or dry chemical oxidation, to create an oxygen-poor surface layer which has charge imbalances (free charges) and is thus reactive.

An alternative approach to wet chemical processing would be to use a combination of dry etching (reactive ion etching) and misting to avoid a wet chemical process. This approach can have advantages in applications with too significant surface topographies (cavities too small to wet properly) or materials too incompatible with liquid solutions.

In one embodiment, the first substrate comprises a Si(100) wafer and the second substrate comprises a wafer having a $SiO_x$ bonding surface, where $0<x\leq2.4$ (e.g. $1.7\leq x\leq1.9$). $SiO_x$ surface layers (sub-stoichiometric $SiO_2$) can be prepared according to methods familiar to those skilled in the art, for example, by etching a $SiO_2$ surface with HF, or by plasma-enhanced chemical vapor deposition from $SiH_4$ in the presence of an oxygen-source gas such as, but not limited to $O_2$ or $N_2O$.

In one embodiment, the first bonding surface is a Si surface, and the second bonding surface is a Si surface. In another embodiment, the first bonding surface is a Si(100) surface, and the second bonding surface is a Si(100) surface. In another embodiment, the first bonding surface is a Si surface, and the second bonding surface is a $SiO_2$ surface. In another embodiment, the first bonding surface is a Si(100) surface, and the second bonding surface is a $SiO_2$ surface. In another embodiment, the first bonding surface is a $SiO_2$ surface, and the second bonding surface is a $SiO_2$ surface.

In another embodiment, the first bonding surface is a Si surface, and the second bonding surface is $SiO_x$ where $0<x\leq2.4$ (e.g. $1.7\leq x\leq1.9$).

In another embodiment, the first bonding surface is a Si(100) surface, and the second bonding surface is $SiO_x$ where $0<x\leq2.4$ (e.g. $1.7\leq x\leq1.9$).

In another embodiment, the first bonding surface is a $SiO_2$ surface, and the second bonding surface is a $SiO_x$ where $0<x\leq2.4$ (e.g. $1.7\leq x\leq1.9$).

In another embodiment, the first bonding surface is a hydroxy-terminated $SiO_2$ surface, and the second bonding surface is a $SiO_x$ where $0<x\leq2.4$ (e.g. $1.7\leq x\leq1.9$).

In certain embodiments, the interphase bonding density between a first bonding surface that is $O_2H_2Si$ (1×1)(100) or hydroxyl terminated $SiO_2$ surface ($SiO_2$—$O_2H_2Si$) and a second bonding surface that is $SiO_x$, where $0<x\leq2.4$ (e.g. $1.7\leq x\leq1.9$), can be controlled by saturating the missing oxygen on the $SiO_x$ dangling bonds with an oxygen carrying molecular species including, but not limited to, O, $O^-$, $OH^-$, and $O_2^-$ on the $O_2H_2Si$(1×1)(100) surface by desorbing Hydrogen from the latter. In certain embodiments, about 5% to about 90% H is desorbed from the first bonding surface by this method. In other embodiments about 10% Hydrogen is desorbed from the first bonding surface.

In certain other embodiments, the second bonding surface comprises a hydroxy-terminated silicate ($O_2H_2$—Si-terminated Silicate), which can be silicate polymorphs (amorphous, polycrystalline, or crystalline) as described herein.

For the preceding bonding surface preparation, the ambient humidity can range between about 40 and 80% or between about 40 and 60% or about 75%. Lower humidity can improve (i.e., decrease) drying times for substrates, which have been prepared as described above. For example, lower humidity can decrease drying times for substrates after the final etching and rinsing steps and thereby decrease the latent time between formation of the first and second bonding surfaces and mechanical contact.

Substrate Bonding

Cross-bridging interphase (i.e., the bonding layer) is nucleated via precursor phases on initial Langmuir-Blodgett (LB) films on the surfaces to be bonded, using wet or spin-etch chemical processing, then contacted and vapor pressurized. The interphases and their properties are synthesized and modulated via the initial LB nanophases, the time to contacting and the applied pressure, and the duration and temperature of a low temperature (25°-200° C.) annealing in an wet oxidizing atmosphere.

a) The different precursor phases are nucleated sequences of repeated etching and oxidation to create LB molecular films on the wafers to be bonded.
b) The resulting two LB molecular films on each of the two surfaces to be bonded, are precursor phases and initiate chemical reactions leading to final cross-bridging. These nucleating phases initiate a uniform chemical reaction across the interface when contacting in an oxidizing atmosphere under $H_2O$ pressurization.
c) The precursor terminated surfaces are thus contacted in a $H_2O$ saturated atmosphere in a pressurized vessel that may have different classes of particulates depending on end product. The time elapsed between surface termination and contacting can be minimized, especially for most the reactive one, typically etched silicates.

The two substrate bonding surfaces can be put into contact in an atmosphere comprising steam and oxygen, at a temperature less than about 200° C., creating pressure that assists in forcing the surfaces to bond, to generate a bonding layer between the same. In certain embodiments, the atmosphere has a relative humidity of greater than about 70%. In certain embodiments, the atmosphere has a relative humidity greater than about 80%. In certain embodiments, the atmosphere has a relative humidity between about 80% and 100%. In certain embodiments, the atmosphere is saturated with water vapor (100% relative humidity). Such conditions can provide a bond with a hermetic seal (liquid-proof in saline solutions, as found in human body fluids, for example). In one embodiment, the bonding surfaces are to put into contact in at a temperature less than about 200° C. or ranging from about 25° C.-200° C. or about 25° C.-100° C. or about 100° C.-200° C. or about 150° C.-200° C.

The two surfaces are brought into contact under a pressure ranging from about atmospheric pressure (no pressure applied, simple contacting by electrostatic attraction) to about 1.1 atmosphere. The pressure can be applied by the application of the atmosphere comprising steam; by mechanical pressure, or by a combination of both. In certain embodiments, the pressure is provided by the atmosphere comprising steam. Higher pressures could also be used.

In other embodiments, electrostatic attraction between the layers to be bonded can be used to bring the surfaces in contact, before pressure is applied. In yet other embodiments, the contacting between the two bonding surfaces can be achieved by touching a first edge of one of the substrates to the bonding surface of the second substrate, and rotating the first substrate onto the second. Such rotation can allow air to escape from between the surfaces and encourage physical contact between the two bonding surfaces.

In an exemplary embodiment, the thermal annealing or sintering or nanobonding contacting procedure between the surfaces can last for at least one minute (residence time of the surfaces in the near vicinity of each other (that is, areas of contact, more than just "point" or "line" contacts between edges of atomic terraces), and typically between about 10 and 200 minutes, to achieve bonding between the surfaces.

In a further exemplary embodiment that can be combined with any of the embodiments of the invention, the bonding conditions comprise application to the assembly of an electromagnetic field. In this embodiment, or all or a portion of the assembly (including but not limited to the interface between the two substrate bonding surfaces) is subjected to an electromagnetic field (EMF) of any suitable field strength. The EMF may comprise a direct current (DC) field, and alternating current (AC) field, or a combination thereof. A voltage applied may of any suitable size for a given purpose, and may comprise a fixed voltage or a varying voltage during the bonding process. In an exemplary embodiment, the electromagnetic field applied comprises a voltage of at least 10 volts.

In exemplary embodiments, an at least class 100 (e.g. class 10 or class 1) clean room environment can be used for the contacting to control for particulates. However, non-clean-room conditions can be used in case of large-scale devices where uniformity of bonding at the nano-scale is not a requirement.

Figure 4:
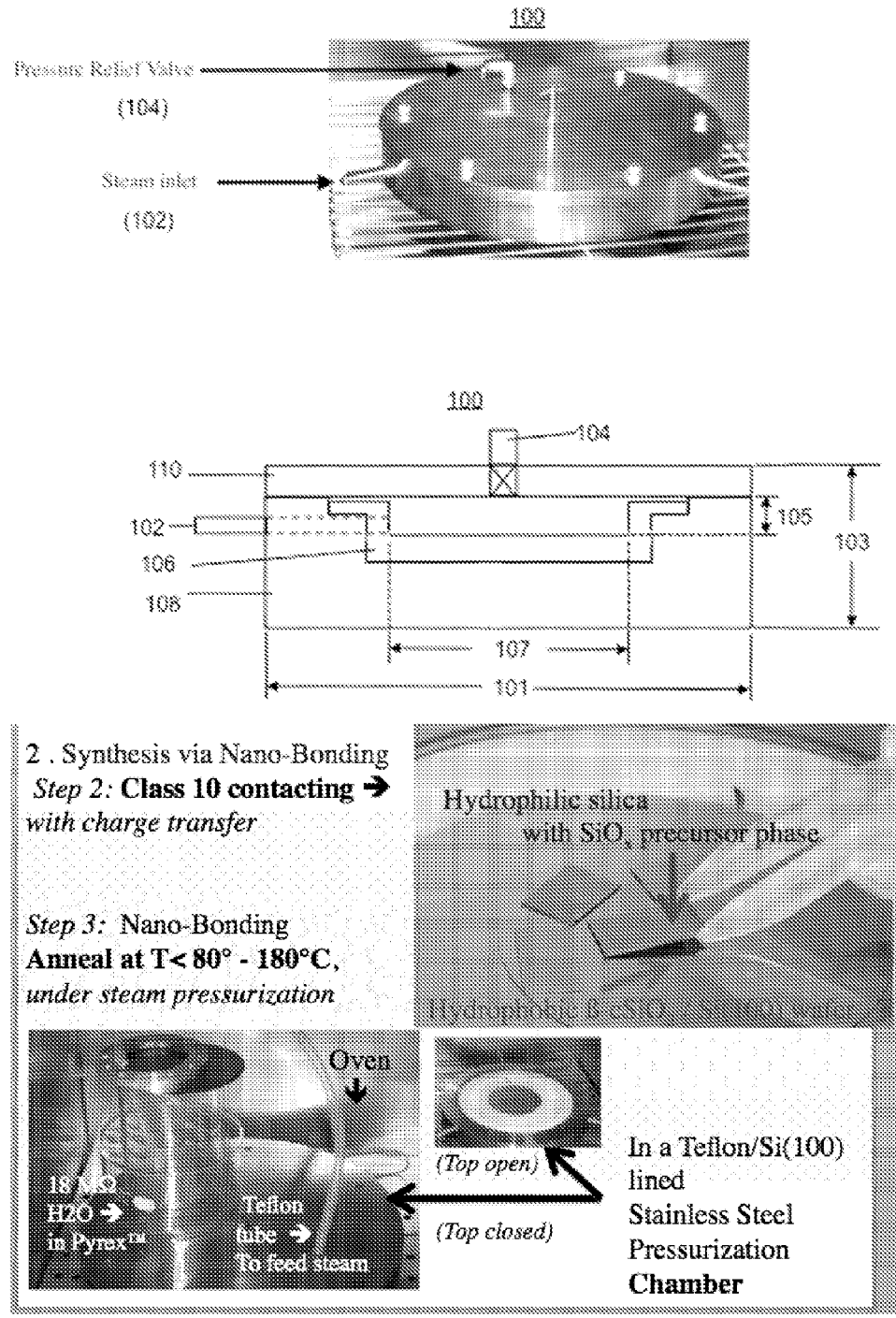
FIG. 4 is a photograph of an exemplary wafer containment and pressurization apparatus according to a mode of the invention.

FIG. 4 shows an exemplary vessel 100 in which the two substrate bonding surfaces can be put into contact. Vessel 100 has an inlet 102 through which steam is introduced. Vessel 100 also has a pressure relief valve 104. Vessel 100 has a lower body part 108 and a top part (lid) 110. The two parts are bolted together and sealed with a viton ring (not shown). In this example, steam inlet 102 is shown at the side of the chamber and pressure relief valve 104 is shown at the top of the chamber. However, other configurations can be used, such as locations of the steam inlet and pressure relief valve being swapped from the positions shown.

In an exemplary embodiment, vessel 100 is a stainless steel vessel. However, vessel 100 can also be made from other materials, including but not limited to glass (such as boronitride glass), Teflon, other metals, and combinations thereof. It has an outer chamber diameter 101 of 5.5 inches and an outer chamber height of 1.375 inches. In an exemplary embodiment, the chamber of vessel 100 is lined with a Teflon liner 106. Liner 106 may comprise other materials including, but not limited to viton and other elastomeric materials capable of withstanding temperatures of up to about 200° C. Liner 106 is an optional component. The inner chamber diameter 105 is 3.5 inches and the inner chamber height 107 is 0.375 inches. In an exemplary embodiment, inlet 102 has a diameter of 0.25 inches. Inlet 102 may be connected to a source of steam/water (not shown) using Teflon tubing with 0.25" diameter. In an exemplary embodiment, the inner diameter 103 of the vessel is at least 5-10% larger than the diameter of the largest wafer or plates that are to be bonded together. However, other geometries can be used that could allow processing for multiple samples, simultaneously. In an exemplary embodiment, the inner height is at least 0.125 inches. The inner height of the vessel is chosen to provide sufficient volume for steam flow.

Figure 5:
FIG. 5 is a photograph showing a heating environment according to a mode of the invention.

FIG. 5 shows an exemplary heating environment 200 in which vessel 100 may be placed. In an exemplary embodiment, heating environment 200 is an oven such as a Fisher Isotemp model 215G oven. However, other heating environments could also be used, including but not limited to different types of ovens, microwave environments and hotplates. Vessel 100 itself may remain unheated, with only water to be heated placed in the heating environment.

Steam is generated in heating environment 200 by heating water contained in a vessel (not shown) placed within the heating environment. The steam is then introduced into vessel 100 through inlet 102. This creates a pressurized atmosphere in vessel 100, which forces the wafers together, without the aid of mechanical clamps. The resulting wafer package is evenly pressurized with no bonding strains or cracking due to mechanical force. In an exemplary embodiment for the exemplary embodiment of vessel 100 with the geometry described above, a flow rate of 0.002-0.2 L/minutes is used. It will be understood that other flow rates can be used, depending on the design and geometry of vessel 100, such that the flow rate generates adequate pressure to achieve bonding.

In certain embodiments, a built-in surface charge distribution can be achieved in an oxide (hydrophilic) surface. An oxide surface generates a significant electrostatic attraction between the first and second bonding surfaces resulting in a room temperature reaction and bond.

The time elapsed between the preparation of the first and second bonding surfaces can be minimized, such as when using reactive surface preparations. Typical durations between the rinsing/drying step and the contacting step can be of the order of about 30 seconds to about 5 minutes with good results, with a longer duration typically leading to weaker bonding. For example, the time between immersion (final) rinsing step after surface termination to prepare a polarized surface and mechanical contact between the first and second bonding surfaces can be minimized. In another example, silicate or the thermally oxidized surfaces processed using a final etching step with aqueous HF, as described above, are highly reactive and are used promptly after their preparation. However, as noted above, Si(100) processed with the Herbots-Atluri clean and exposed to a static and inert atmosphere exhibits extended chemical and structural stability, as noted above, and can bonded at a later time.

When RTA is used as a final thermal step, dopant activation and silicide contact formation can be affected while forming the wafer bond. For example, implantation of dopant (e.g., boron, phosphorus, arsenic, and/or antimony), can be used both in the cases of Si(100) or silica polymorphs, and can be activated through RTA thermal steps. Adjustment of temperature and annealing duration can achieve nanobonding while both minimizing dopant segregation at the thermal interface and ensuring effective thermal diffusion and electrical activation of dopants. In other examples, the same approach can be done when using simple furnace annealing. When dopants are implanted, prior to contacting and nanobonding, through refractory metallic gates or contacts (e.g., using metals such as titanium, niobium, titanium-tungsten, including solid solution of TiW, vanadium, zirconium and iron), the thermal steps can electrically activate dopants, create a nanobond, and drive silicides and gate oxide formation.

The present invention provides methods for forming a bond between two substrates between approximately room temperature and approximately 200° C., with a bonding strength that can be modulated between 8 and 12 MPa.

The resulting bonding phases bridges between the bonded surface both at a macroscopic and at a nanoscale level and has the advantage of being only one to several molecules thick (e.g., 0.5 to 2 nm), but can range to up to 40 nm, and having a "fully compatible chemical composition", transitioning from one substrate to the other. The bonding phases are generally two-dimensional silicate polymorphic phases and may have sections that have only 1, 2 or 3 interatomic distances in regions where two atomic terraces intersect at the interface between the wafers or substrates.

The fully compatible chemical composition of the bonding phase results in the same bonding coordination as in the bonded substrates. The polarized surface can enable the nucleation and growth of the nanobonding phase by driving and organizing the nucleation of a cross-bonding phase. The precursor phase acts as a geometric template. It guides the alignment of charges, electronic orbitals, dangling bonds and dipoles in the molecules on the surface into a stable geometric and chemical configuration similar—as in a tetrahedrally coordinated-like configuration—to that of the bulk of the wafer bonding materials. This occurs along and across the interface. The molecules thus provide a chemical template orthogonal to the flat surface at the nano-scale. In this way, the mechanical strength of the bond resulting from this template-driven chemical reaction is at least as strong as the bulk of the wafer because it is essentially a similarly coordinated chemical reaction occurring orthogonally across the interface. Consequently, this provides a low stress, mechanically strong but plastic bond. The present techniques minimize built-in stress between the bonded materials, and do not require any physical deposition or plasma/sputtering/dry etching processing, to achieve bonding strength above the intrinsic breakage point of the bonding materials. The bonding layer formed between two substrates according to the methods presented here typically comprises Si and $O_2$, with H-doping while the structure of each specific nanophase (i.e., bonding layer) is determined by the bonded surface combination and processing conditions. For example, a bonding layer, or nanophase, between a Si surface and $SiO_2$ surface, as detailed above consists essentially of Si and $O_2$.

Preparing surfaces by a method such as the Herbots-Atluri method (described in U.S. Pat. No. 6,613,677) or related methods (described in U.S. Pat. No. 7,851,365) can decrease by up to 3 orders of magnitude spurious chemisorbed and physisorbed species such as carbon contamination on the surface. The adsorption of such species can compromise the integrity of any bond made using the surface.

The use of Herbots-Atluri-prepared surfaces in combination with high purity steam-pressurization catalysis of room temperature wet oxidation can nucleate and grow new vitreous and ordered $Si_2O_4H_4$ inorganic polymer chains that cross-bridge Si(100)/Si(111) and various $SiO_2$ phases. The bonding nanophaseis a hydroxylated cross-bridging two-dimensional interphase between wafers that can be nucleated and synthesized via steam pressurization as described herein.

Figure 10:
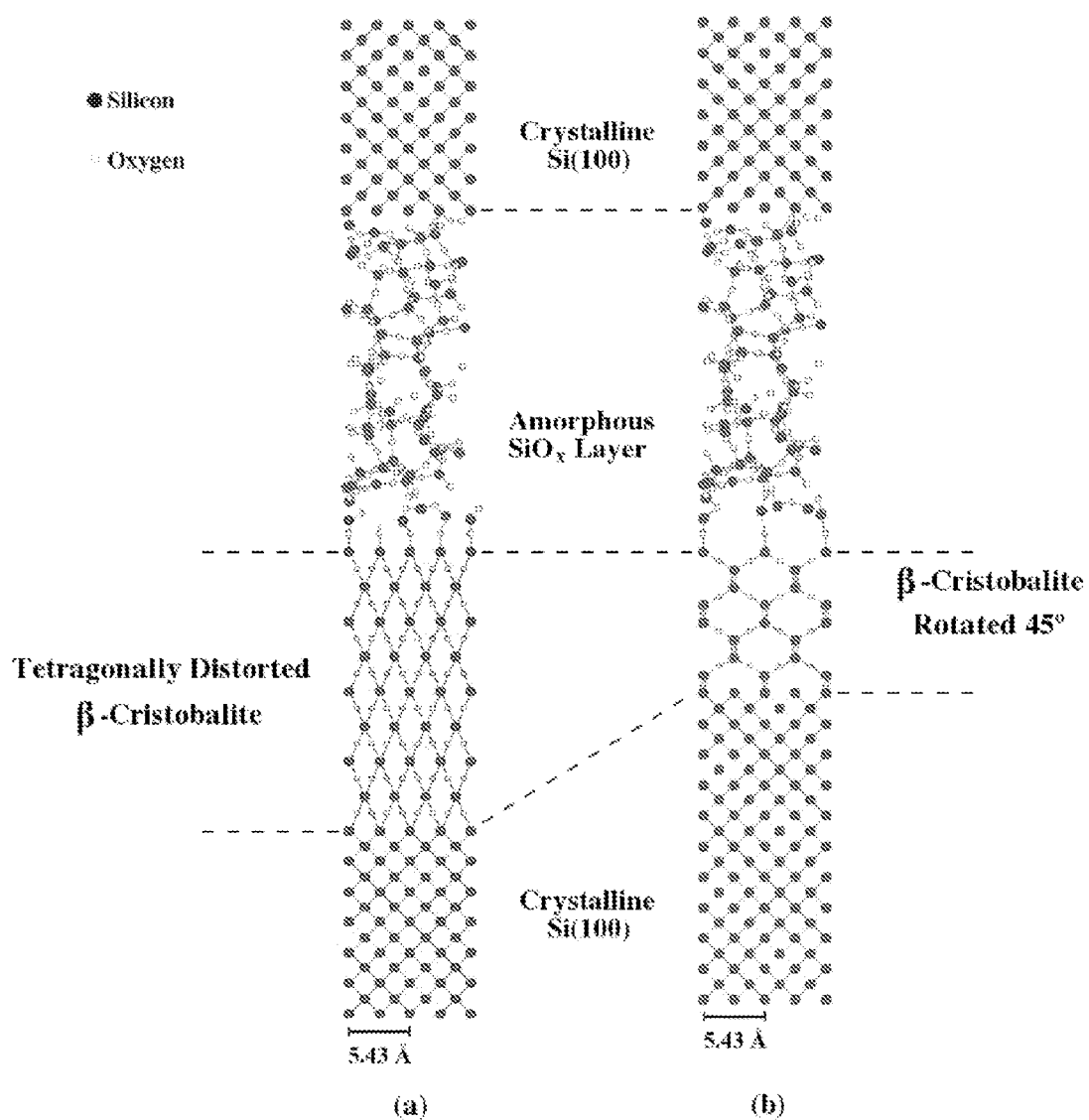
FIG. 10 shows schematically two examples of bonding of a Si(100) wafer to a Si(100) wafer via a nanobonding phase of the invention with two precursor phases of $\beta$-cSiO2 and SiOx and the nano-bonding interphases
Figure 11:
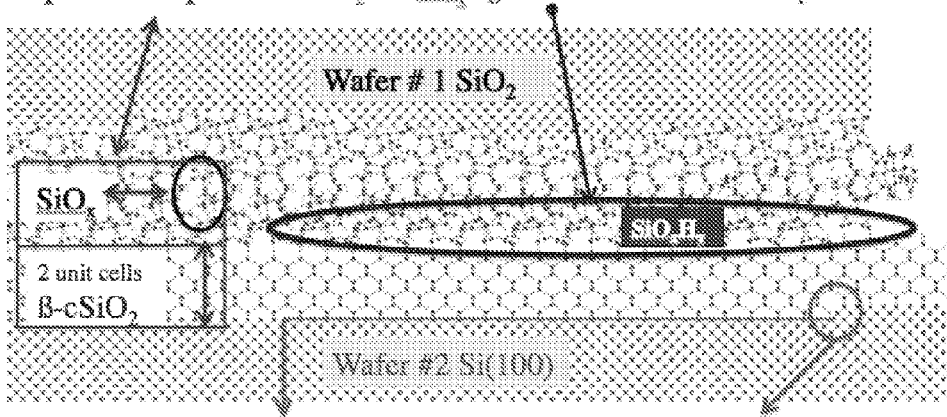
FIG. 11 shows the Surfaces Energies, hydro-affinity and nanobonding yield in a table and the matching nanobonding stack device with macroscopic nanobonding domains extending over 20 nm nucleated by the two precursor phases of $\beta$-$cSiO_2$ and $SiO_x$ and the resulting $SiO_xH_y$ interphase.

FIG. 10 shows schematically two Si(100) wafers bonded together via the bonding nanophase. These images were created using CrystalMaker software. On the lower Si(100) surface in each example, a beta-cristobalite layer is formed. The bonding nanophase forms between the beta cristobailite layer and the surface of the upper Si(100) substrate. In FIG. 10A, the beta-cristobalite is a tetragonally distorted beta-cristobalite (100) layer, with an oxygen termination. In FIG. 10B, the beta-cristobalite is beta cristobalite (110), rotated by 45°, with an OH termination, and fits the underlying Si(100) crystal structure.

Using this bonding method, the $Si_2O_4H_4$ is combined with $SiO_2$, SiOH, $SiO_2H_2$ (and various $SiO_x$, $SiO_xH_x$) where the strategically bonded hydrogen (H), hydroxyl (OH), and siloxane (SiOH) groups adds significant plasticity to the silicate-based interphase nanobonding the two macroscopic surfaces. The hydroxylate interphase has a plastic deformation range well beyond the "dry nanobonding" nanophases, such as those described in patent application PCT/US2010/033301, incorporated herein by reference. Methods of the invention minimize built-in stress between dissimilar bonded materials with thermal mismatch, unlike any other processes used in wafer bonding (e.g. as described in U.S. Pat. No. 6,902,987).

The nucleation of these molecular cross-bridges is controlled by the ordered molecular arrays in the Herbots-Atluri generated precursor phases. These ordered arrays of $Si_2O_4H_4$ add significant plasticity to the silicate-based interphase nanobonding the two macroscopic surfaces. This plasticity, which is absent from both vitreous silicates and crystallized silicates like beta-cristobalite, quartz, and tridymite grown in dry conditions, ensure a more resilient, much less brittle bonding phase, which can withstand thermal expansion mismatch, and mechanical pressure during medical electronic implant manufacturing.

The bonding method can also better handle the desorption of adsorbates in device cavities and air-insulated encapsulated capacitors, for example, by allowing both some bowing and incorporation of the absorbate in the network of the inorganic silicate chains and ring structures connecting the $SiO_2$, $SiO_x$ and $Si_2O_4H_4$, $SiO_xH_y$, monomers in the wet nanobonding interphase. Parasitic desorption during conventional wafer bonding can lead to cavity explosion, wafer shattering, wafer delamination and generally catastrophic mechanical damage. Combining the plasticity with the hermeticity of nanophases and bonding layers that are formed by methods of the invention overcomes these issues.

The nature of the nanophase (i.e., bonding layer) makes bonding by the methods presented here intrinsically compatible with both Si-based device and bio-medical applications. In addition, the process of nucleation and synthesis of the bonding layers (i.e., cross-bridging interphases) uses chemicals and oven annealing conditions below 200° C. that are intrinsically compatible with standard devices, silicates and other ceramics processing and/or sintering.

In other embodiments, multiple wafers can be bonded together either sequentially, or simultaneously, provided the surfaces to be bonded fulfill the conditions described above. For example, a stack of three wafers could be bonded together to make an assembly with two bonded interfaces. In some embodiments, the third wafer could be bonded to an existing bonded wafer assembly of two wafers that has been formed using a first bonding step.

DEFINITIONS

As used herein, the term "Herbots-Atluri Clean" and the "Herbots-Atluri Method" refers to the semiconductor cleaning process as disclosed in U.S. Pat. No. 6,613,677, incorporated herein by reference in its entirety.

As used herein, "$O_2H_2$ (1×1) Si(100)" refers to the stabilized ordered (1×1) Si<100>wafer surface having a surface comprising a 2-D Langmuir-Blodgett film consisting of ordered arrays of (OH)⁻ silanol groups.

As used herein, the term "semiconductor" means any material that is not intrinsically a good conductor and that has a small enough band gap that it could conceivably be doped to function as a semiconductor (i.e. a band gap that is less than approximately 10 eV) and that is chemically and otherwise compatible with the process of the invention.

As used herein, the term "semiconductor-grade" means the component has a purity of at least 99%; for example, the purity can be at least 99.9%; in other examples, the purity can be at least 99.99%.

As used herein, the term "polarized surface layer" means a layer where the electronic charges in the surface are not free to move. Since the charges are not free to move, they do not readily respond to the dipole moment of water molecules. The layer is therefore hydrophobic (lacking affinity for water) and the water molecules only interact with each other, causing water to form "beads" on the surface.

As used herein, the term "hydrophilic surface layer" means a layer having a strong affinity for water. Water molecules are strongly polarized dipoles. Free charges at the surface of the hydrophilic surface layer respond to the water dipoles, resulting in water adhering strongly to the surface, instead of beading, resulting in a thin layer of water wetting the surface consistently.

As used herein, the term "interphase" or "bonding phase" means a phase of a material between the two phases of the materials that have been bonded. Interphases are synthesized sequentially in the form of molecular (two-dimensional) sheets with a thickness ranging between 0.5 nm and about 40 nm, unless otherwise defined.

As used herein, the term "nanobonding" refers to bonding over localized regions, typically 5 nm-30 nm (the typical size of the atomic terraces), as opposed to larger scale macroscopic or chemical bonding over an entire substrate.

As used herein, the term "oxidizing atmosphere" an atmosphere containing at least 1 vol % $O_2$. Oxidizing atmospheres include, but are not limited to ambient air and essentially pure $O_2$ gas sources.

As used herein, the term "essentially flat" means atomic terraces that are about 20 nm (200 Å) apart in average, with no chemical oxide pitting or pinholes.

As used herein, the term "silicate" as used herein means substrates comprising $SiO_2$ or $SiO_x$, including, but are not limited to, substrates comprising silicate polymorphs (amorphous, polycrystalline, or crystalline) such as thermal $SiO_2$ grown on Si, α-quartz, beta-quartz, borosilicate wafers, alpha-cristobalite, beta-cristobalite, coesite, tridymite, and/or amorphous silica.

As used herein, the term "silicate wafer" means a substrate comprising at least a $SiO_2$ surface layer and which may contain other oxide materials, for example, a borosilicate wafer or aluminosilicate wafer. In another example, a silicate wafer comprises a Si(100) substrate having a $SiO_2$ surface layer thereon. In certain embodiments, a silicate wafer comprises a Si(100) wafer having a $SiO_2$ surface layer thereon.

As used herein, the term "fully compatible chemical composition" means that the material (or phase) has a similar bonding coordination as the materials either side of the material (or phase).

Exemplary Embodiment of a Wafer Bonding Processing Sequence

An exemplary embodiment of a processing sequence will now be described.

Step 1: Wafer Surface Preparation

Figure 6:
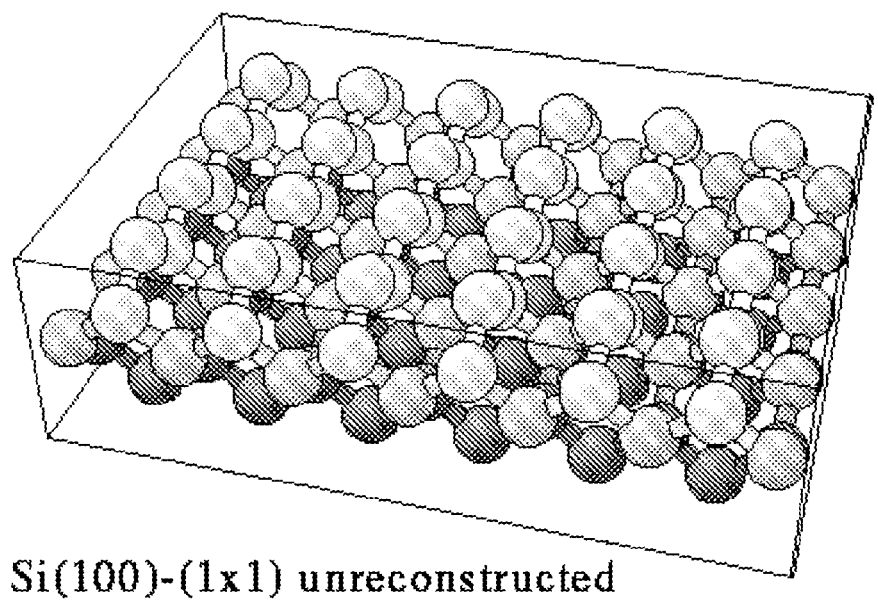
FIG. 6 shows schematically a perspective view of a Si (100) surface.

The two wafers or substrates or surfaces to be bonded are processed in parallel so that they emerge from the surface cleaning and surface termination as simultaneously as possible. The surface preparation is meant accomplish for both wafers, the following things:

Wafer Surface 1:
  a) PLANARIZATION STEP: First using the Herbots-Alturi clean—an initial etching followed by chemical oxidation and then again etching in passivating conditions such as HF:methanol (5:95) extend atomic surfaces on both surfaces to maximize flat, two-dimensional area and minimize the number of three-dimensional steps.
   b) TERMINATION STEP: this step minimizes pinholes at the surface and reduces "atomic debris" left on the surface, by adjusting the etching to 60 seconds in a 5% HF 95% methanol solution, which preferably is followed as soon as possible by a 5 minutes rinse in pure methanol and pulling the surface dry from the solution.
   c) RINSING AND DRYING BY PULLING OUT OF THE METHANOL RINSING SOLUTION: the resulting, flattened surface is then terminated by a two-dimensional sheet of ordered aligned $Si_2O_4H_4$ molecules attached to the resulting Si(100) surface shown in perspective with the $Si_2O_4H_4$ molecules attached in ordered arrays to terminate the surface (FIG. 6). This surface nanophase provides a microscopic template to drive the bonding reaction uniformly with the densest possible location of identical bonding sites side-by-side for oxidation.
   d) An extra (optional) step can be performed to ensure that the surface does not retain hydroxylated species, by using a non-contaminating, class 10 absorbing media (for example a nylon or cotton clean-room lint-free wipe) to draw quickly, efficaciously and reproducibly in a minimum amount time (ideally less than 60 seconds, although it can be a few minutes).

Wafer Surface 2:
   a) The successive etching and passivation create the same terraces formed by step (a) for wafer surface 1, but the surface is not terminated by ordered arrays of $Si_2O_4H_4$.
   b) For this surface, the pinhole density is increased by etching with aqueous HF (e.g., using $HF:H_2O$ 1:99), for 60 seconds to initiate reactive sites without creating major pitting, or pinholes larger than a few missing atoms. The two surfaces have then strongly opposite character—one being strongly hydrophobic and the other strongly hydrophilic, one perfectly terminated and stable and the other strongly reactive. For the two wafer surfaces prepared as described above, the $SiO_2$ surface is hydrophilic, and the Si(100) surface is hydrophobic.
   c) An extra (optional) step can be performed to ensure that the surface does not retain hydroxylated species, by using a non-contaminating, class 10 absorbing media (for example a nylon or cotton clean-room lint-free wipe) to draw quickly, efficaciously and reproducibly in a minimum amount time (ideally less than 60 seconds, although it can be a few minutes).

Step 2: Contacting

The second step consists of bringing together the two surfaces to be bonded and can take place at room temperature. The surfaces are put in contact as quickly as possible as they emerge from their solutions and dried. The timing of the process can be adjusted so the time when they are dry from the last rinse coincide as much as possible. For example, by first pulling the second (reactive) wafer from the rinsing deionized water and allowing it to dry (which takes typically minutes) and then pulling the first wafer from the methanol rinse; which dries very quickly (typically 10 seconds). This technique maximizes bonding uniformity, reactivity, and area, and avoids particulate re-contamination.

The bonding nanophase is nucleated and synthesized via steam pressurization to form a hydroxylated and cross-bridging two-dimensional interphase between the wafers. As oxygen molecules decompose to react with the second surface, the bonds are grown from the oxide templates and the reactive surface simultaneously. The density of the first surface oxide induces the new oxide molecules formed to align themselves with the first surface into a denser oxide than if the surface was not present, and cross-bonds because of the identical chemical nature of both phases in close contact. This enables overlap of extended orbitals from the reactive second surface into the first surface.

The interphase comprises the elements Si and $O_2$, with H-doping and OxHy-termination, while its structure depends on the bonded surface combinations and processing conditions. This makes bonding by the interphase provided herein intrinsically compatible with Si-based devices and bio-medical applications. In addition, the process of nucleation and growth of the cross-bridging interphases uses chemicals and oven annealings below 200° C. intrinsically compatible with device/electronics processing, silicates, and ceramics processing.

Step 3: Thermal Annealing Under Resilient Compression and/or Pure Steam Pressurization The reaction can be further driven and extended into a thicker, more hermetic phase with increased tensile strength of at least 8 MPa (tester limited) by annealing below 200° C. (for example 160° C. to 180° C.) in ambient clean-room air with approximately 40% humidity, while remaining under resilient compression. However, resilient compression does not have to be used, and pressurization of the steam environment only may be used. If resilient compression is used, the resilient materials can be annealing-resistant rubber up to 200° C. Cladding with Teflon and/or glass or silicate materials would also work for fragile materials. A stainless steel or quartz vessel can be used to conduct the annealing.

EXAMPLES

Example 1

Wafer Cleaning and Intermediate Processing

A wet chemical clean and passivation for Si(100) wafers was developed in previous research by Atluri and Herbots et al. (see, U.S. Pat. No. 6,613,677). This process is unique in that it produces an ultra-flat (1×1) Si(100) ordered surface with extremely low surface impurity contamination compared to the well-known RCA type wet chemical cleans.

This method involves the optional intermediate processing of the wafers prior to bonding which includes packing the cleaned wafers in polypropylene or fluoropolymer containers under dry nitrogen and sealing them in plastic bags filled with dry nitrogen. Wafers can be stored under dry nitrogen for 30 minutes to 3 days prior to thermal processing, or even longer. Wafers stored for over a year in sealed containers under dry nitrogen showed no evidence of an increase in surface contamination (e.g. accumulation of carbonaceous impurities) as measured by Time of Flight Secondary Ion Mass Spectrometry (TOF-SIMS). TOF-SIMS data was collected as described in Herbots, et al., Mater. Sci. Eng. V87, 303 (2001). In addition, the carbon concentration NEAR the surface is made lower than in the bulk to limit carbon segregation and SiC precipitates formation.

Example 2

Low temperature (25° C.-200° C.) bonding between Si(100) and oxide wafers, either made of silica or oxidized Si(100) is achieved through a dual wet chemical process which terminates the stabilized ordered (1×1) Si<100>wafer surface in air at room temperature with a 2-D Langmuir-Blodgett film consisting of ordered arrays of (OH)⁻ silanol groups ($O_2H_2$ (1×1) Si(100)). The parallel wet chemical processing of the other oxide wafer surfaces in the bonding pair renders the $SiO_2$ sub-stoichiometric in oxygen and therefore hydrophilic with a net surface polarization, which can even result in a macroscopically observable net negative charge. If the surface of the $O_2H_2$ (1×1) Si(100) is ordered, the net charge is very significant and the attractive force between it and other wafers sufficient to overcome the force of gravity to lift a wafer directly underneath for a distance of an inch to a centimeter or less. The overcoming of the force of gravity between the top wafer and the lower wafer to be bonded when put into contact is a good monitoring criterion for successful bonding and can be used in both in optimization testing and manufacturing.

The Si and oxide surfaces are attracted to one another when put into contact and consequently form a bond at room temperature. Two silicate wafer can also be used where one is silanol terminated (OH)⁻ termination of dangling bonds) and the other oxygen depleted ($SiO_x$, with $0<x<2.4$) within the top 1 nm-2 nm of the surface. One or both wafers may have an amorphous surface. However, ordering increases electrostatic attraction, charge exchanges, and room or low temperature chemical bonding to form a cross-bridging interphase.

Cross-Bonding via chemical oxidation of the surfaces in contact requires the two surfaces to be brought within nanometer separation distances of each other to allow cross-bridging during reoxidation of both surfaces and the formation of a new interphase between the two. The application of uniform compression can overcome the Coulomb repulsion force where necessary if domains of identical charges are present on the two surfaces to be contacted, irrespective of the presence of the same surface of mixed charge domains, line charges and point charges.

Electrostatic repulsion has to be overcome, and should be minimized. However, it is a positive criterion for detecting charge imbalance and increased reactivity of the generated precursor nanophase and decreased large-scale surface geometry warping (of the order of 100 microns in wavelength) in the wafer. A 20 minutes to 24 hour 120° C.-180° C. anneal in controlled ambient air is used to activate the silanol molecular film on the (1×1)Si(100) surface [$O_2H_2$ (1×1) Si(100)] and the oxidation process by which molecular cross-bridging and additional bonds between the $O_2H_2$ (1×1) Si(100)) and $SiO_2$ wafers are created. In one embodiment the anneal takes place at a temperature of about 180° C. for approximately 24 hours. In another embodiment, the anneal time can be approximately 20 minutes long, and this can suffice under optimum polarization conditions.

In an exemplary embodiment, the Si wafer is cleaned according to the following steps (DI=deionized water):

| | |
|---|---|
| DI rinse | 5-10 minutes |
| SC1 clean | 5-10 minutes |
| DI rinse | 5-15 minutes |
| $H_2O$/HF etch | 1 minute |
| DI Rinse | 12-15 minutes |
| SC2 clean | 5-10 minutes |
| DI rinse | 5-10 minutes |
| HF/methanol etch | 1 minute |
| Methanol wash | 5-7 minutes |

After the above processing steps have been performed, an extra (optional) step can be performed to ensure that the surface does not retain hydroxylated species, by using a non-contaminating, class 10 absorbing media (for example a nylon or cotton clean-room lint-free wipe) to draw quickly, efficaciously and reproducibly in a minimum amount time (ideally less than 60 seconds, although it can be a few minutes).

The $SiO_2$ substrate is cleaned according to the following steps:

| | |
|---|---|
| DI rinse | 5-10 minutes |
| SC1 clean | 5-10 minutes |
| DI rinse | 5-10 minutes |
| $H_2O$/HF etch | 1 minute |
| DI Rinse | 15-20 minutes |
| SC2 clean | 5-10 minutes |
| DI rinse | 10 minutes |
| HF/$H_2O$ etch | 1 minute |
| $H_2O$ wash | 1.5-7 minutes |

After the above processing steps have been performed, an extra (optional) step can be performed to ensure that the surface does not retain hydroxylated species, by using a non-contaminating, class 10 absorbing media (for example a nylon or cotton clean-room lint-free wipe) to draw quickly, efficaciously and reproducibly in a minimum amount time (ideally less than 60 seconds, although it can be a few minutes).

A Si(100) wafer can be bonded according to the methods of the invention to a second Si(100) wafer having a 100 nm thermal $SiO_2$ layer grown thereon. After bonding, the wafers are bonded with a bonding strength greater than 10 MPa as evidenced by failure (breakage) of the wafers when attempting to pull apart by hand.

Figure 7:
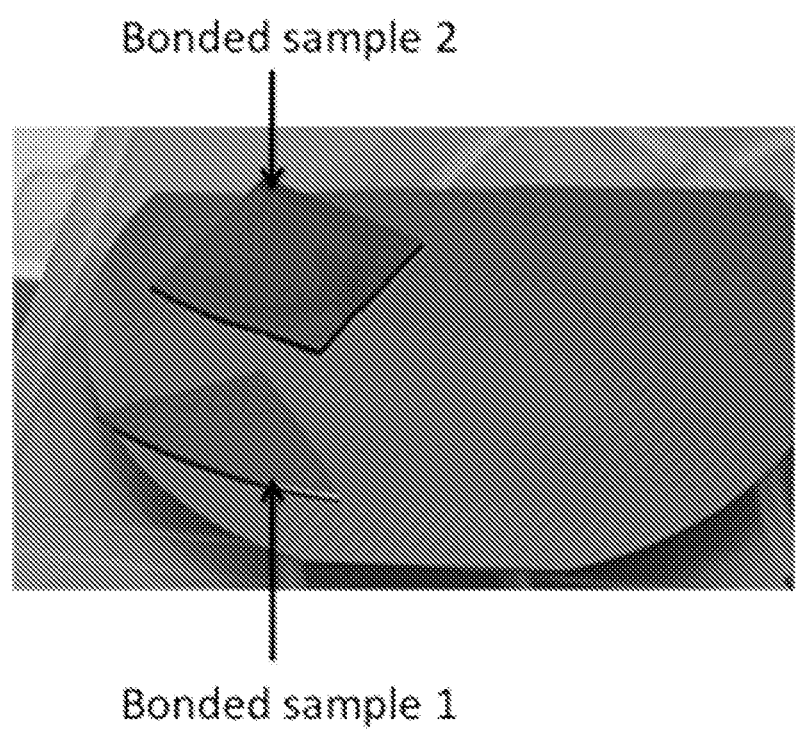
FIG. 7 shows photographs of fused silica bonded to Si(100), according to methods of the invention.

FIG. 7 shows photographs of two fused silica samples bonded to a Si(100) wafer. For bonded sample 1, the $SiO_2$ surface was prepared using a 2% electronics grade HF etch solution for 1 minute. For bonded sample 2, the $SiO_2$ surface was prepared using a 10% electronics grade HF etch solution for one minute. The samples were brought into contact at a temperature of approximately 22° C. and a humidity of approximately 41%. The bonding step took place at a temperature above 80° C.

Figure 8:
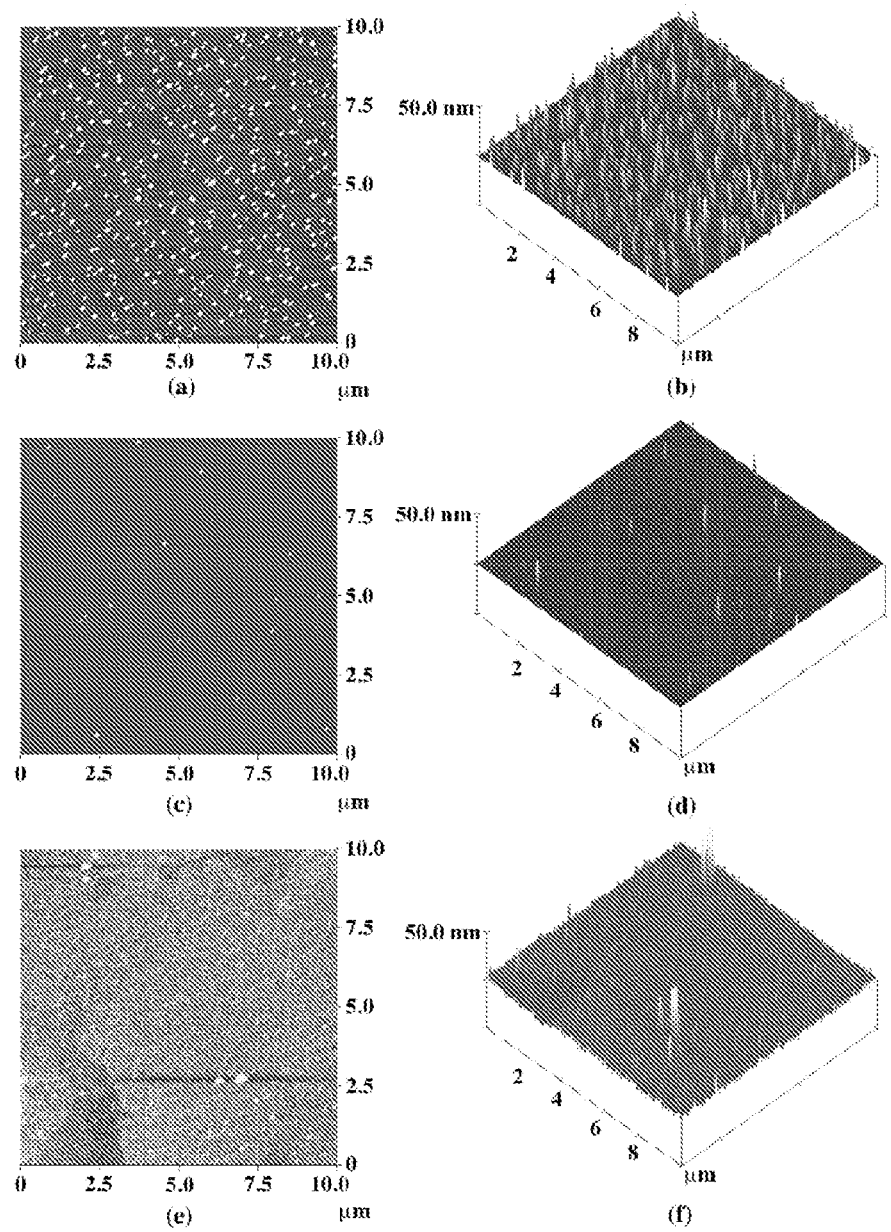
FIG. 8 shows top-view and 3-D-view atomic force microscopy images of Si(100) wafers, processed according to methods of the invention.

FIG. 8 shows top and 3-D view atomic force microscopy (AFM) images of wafers processed according to methods of the invention. FIGS. 8(*a*) and (*b*) show the surface of as-received wafers, which display many particles on the surface as evidenced by the number of peaks appearing in the image. FIGS. 8(*c*) and (*d*) show the surface of Si wafers planarized for $H_2O$ nanobonding by the Herbots-Atluri clean. These demonstrate a decrease in particulates with lower atomic-step density. FIGS. 8(*e*) and 8(*f*) show AFM images of Si(100) after de-bonding of bonded wafers. These show that the surface has been thoroughly bonded across the interface into the bulk. The >8 MPa fracture occurred below the bonded interface, as the roughness values extracted in table 1 demonstrate. Table 1 shows RMS values extracted from 100 nm regions of the AFM images of FIG. 8 for Si(100) at each key nanobonding step. The 100 nm scan size is used to compare the Si roughness of images collected between large particulates. The table numerically confirms that the Si(100) wafer becomes smoother after the combination of Herbots-Atluri method and 180° C. anneal. The de-bonded wafer is roughened substantially to a level that is threetimes the "as received" wafer and suggests that the surface has been modified by the de-bonding, as could be identified visually in FIG. 8. This larger surface roughness is attributed to breakage that occurs at the interface between the Si and the nanobonded phase.

These values are instrumental to optimize and establish the degree of atomic smoothing and steps needed to create a reliable mechanical contact at the nanoscale with a gap small enough that molecular reactions catalyzed at room temperature can bridge.

TABLE 1

| Si(100) Wafer Processing Step | RMS (nm) Position 1 | RMS (nm) Position 2 | RMS (nm) Position 3 | Average RMS (nm) ± Std Dev. | Relative Change to As Received ± Fluctuation |
|---|---|---|---|---|---|
| As Received | 0.12 | 0.17 | 0.15 | 0.15 ± 0.03 | 1.0 ± 0.2 |
| H-A processed + nanobonding | 0.12 | 0.17 | 0.11 | 0.13 ± 0.03 | 0.7 ± 0.2 (30% smoother, same uniformity) |
| After Mechanical De-bonding | 0.87 | 0.100 | 0.38 | 0.45 ± 0.4 | 3.0 ± 2.7 (300% rougher, 270% more fluctuation) |

Figure 9:
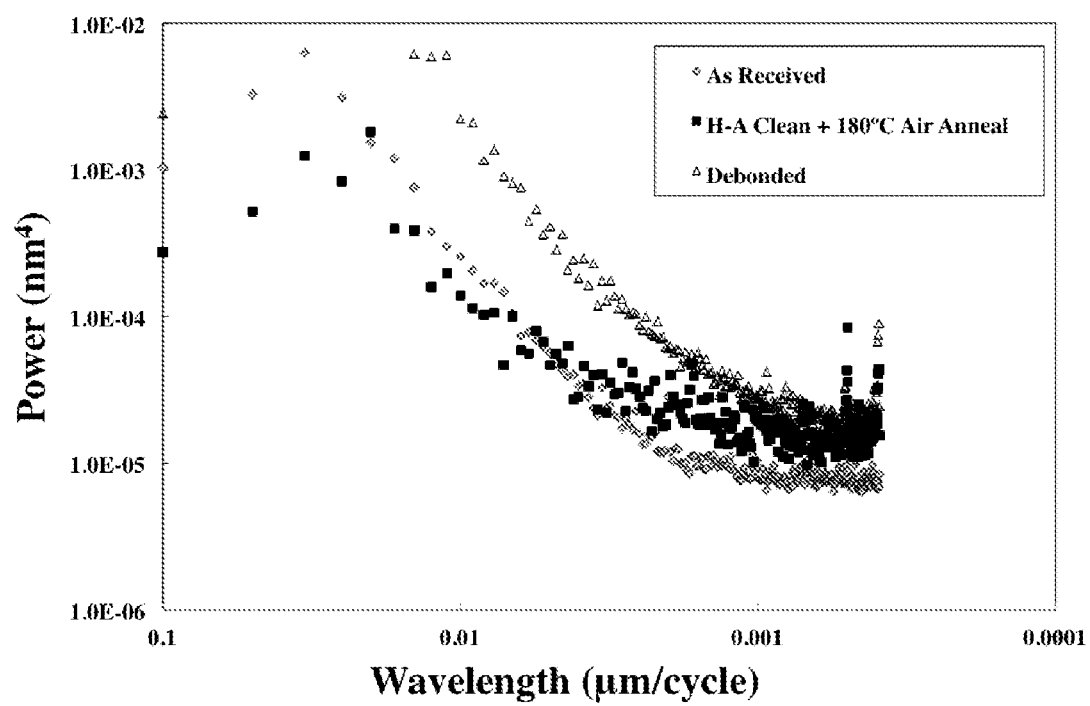
FIG. 9 shows two-dimensional Power Spectral Density (2D PSD) graphs from the AFM images shown in FIG. 8.

FIG. 9 shows two dimensional Power Spectral Density (2D PSD) graphs from the AFM images of the As Received Si(100) wafer, Si(100) wafer after Herbots-Atluri clean and 180° C. anneal, and Si(100) after De-Bonding (i.e. the wafers of FIG. 8). Each PSD is an average of three AFM images collected for the separate sample types. The graph plainly indicates that the Si in the de-bonded sample has been roughened at all wavelengths, indicated by higher power, above 0.001 µm. This indicates a change the topography of the sample.

Device Manufacture

The process of this invention can be used to make a variety of different devices including:

a) Wafer Bonding in Medical Electronics Applications.

Pairs of devices such as biosensors and their electronic processors, which regulate drug delivery based on the sensor signal, have to be integrated in one single implantable device. Such integrated implants usually need to be hermetically sealed to resist a saline environment such as a human or an animal body for the lifetime of the implant. The sensors and processors/regulators are typically based on silica wafers (including but not limited to boro-silicate, alpha-quartz) and Si(100) wafers. The present technology enables the formation of a hermetic bond between the two types of substrates using wet chemical processing. Since a standard wet chemical processing is required prior to any device processing, the present methods with their unique controlled nucleation via Langmuir-Blodgett films of precursor 2-D phases leading to hermetic, highly uniform bonding interphases (i.e., bonding layers) can easily be integrated into current manufacturing processes, requiring only the addition of alcohol such as methanol to the chemicals already typically in use. High purity chemicals such as 18 MΩ $H_2O_2$, Class 1 ppb $H_2O$, HCl, HF, and $NH_4OH$ are best used to generate the 4:1:1 ($H_2O:H_2O_2:NH_4OH$) SC1, the 4:1:1 ($H_2O:H_2O_2:HCl$) SC2, the (99:1) $H_2O:HF$ and the (95:5) Alcohol:HF. Alcohol can be methanol, ethanol, and isopropanol). The purity and particulate requirements for the chemicals used are similar to those required in ULSI.

Specific examples of direct applications are implants combining a glucose sensor and insulin pump in one single device ("artificial pancreas"), as well as blood chemistry sensors combined with a pump in a single implant. Other examples of hermetically bonded multiple device single implants are blood pressure monitors bonded to a medication pump that can deliver both vaso-constrictive (such as proamatine, Midodrine and caffeine) and vaso-dilative drugs to regulate pressure. The bonded wafers can also be used with protein marker sensors for specific cancer and tailored chemotherapy plus the drug cocktails for antiviral medication.

The real-time adjustment of drug dosing, (the combination of drug cocktails and delivery via analysis of the detecting sensor signal in one integrated, small device) greatly increases the effectiveness of drug treatment by improving its targeting of specific cancer cells and virus populations, decreasing side-effects from drug overload and "scorched earth approach" cancer chemotherapy, decreasing the cost of treatment by reducing drug amounts used and therefore net costs, and eliminating organ damage from drug overdoses.

b) Solar Cell Encapsulation on Glass Substrates.

Two major issues of solar cells technology are reliability (longevity of performance) and cost. The capability of bonding directly to glass silicon solar cells (whether low cost a-Si, polySi or single crystal substrate) can eliminate the need for less durable epoxy bonding (10 years longevity, compared to 30 years for glass bonding), increase reliability (better thermal expansion match, especially, fewer cracks and delamination), increase performance (increased optical transparency and UV-IR absorption compared to epoxy bonding), and increase current collection (reduced surface recombination due to reduced surface defect density, surface conductivity can be engineered to collect current along the interface).

c) Integrated Water-Compatible Semiconductor Devices.

Semiconductor devices, such as sensor cavities on silica bonded to either Si(100) or silicon supported electronic, and integrated power sources can be integrated to form marine electronics and human body-compatible medical implants.

1) The Herbots-Atluri clean and precursor phases formed by the wet chemical processing described above can produce an oxygen-depleted terminated $O_2H_2Si(1\times1)$ (100) or $O_2H_2O_2H_2$—Si-terminated Silicate polymorphs (amorphous, polycrystalline, or crystalline) which can be bonded to any silicate, provided the silicate (e.g., alpha-quartz, beta-quartz, beta-cristobalite, alpha-cristobalite, coesite, tridymite, amorphous silica, or thermal oxides,). Silicates can be oxygen depleted, for example, by a HF etch of the silica. Thus, one surface layer can be an oxygen depleted silicate polymorph $SiO_x$, with $x \leq 2.4$, and the second can be $H_2O_2$— terminated by our acid-alcohol-based unique chemistry as described herein.

2) The bonding phase between $O_2H_2(1\times1)Si(100)$ and oxygen-depleted $SiO_2$ ($SiO_x$) creates a nanobond by reacting the two materials together in the presence of $O_2$ and $H_2O$.
3) About 10% of the total surface area of the two contacting wafer surfaces should be in "nano" contact via (1) the elimination of wafer warping, by steam caused pressurization or vacuum suction, and/or (2) atomic planarization of the Si(100) and crystalline silica polymorph by the wet chemical processing method described above. Most amorphous silica does not require extensive atomic planarization. The planarization can be done prior to patterning, device formation, or sensor and cavity formation when the wet chemical processing is not compatible with the electronics deposited. The bonding phase between the two wafer surfaces occurs both at the macroscale and at the nanoscale. Large scale steam pressurizarion or compression can overcome, electrostatic repulsion between domains and other features, and the peak-to-peak wafer topographical wafer warp that ranges between 40 and 160 microns. The wide atomic terraces from wet chemical planarization facilitates the creation of the interphase where the two wafer surfaces are bonded, whether both are silica, Si(100) or a combination thereof. Close geometric proximity promotes formation of the interphase by reducing its final thickness starting 1 nm proximity, the point of actual contacting between flat terraces to a few nm to less than 10 nm. That is, the interphase can bridge separations between surfaces. Alternatively, silica polymorphs, wafer pairs, Si(100) wafer pairs, combinations thereof, and patterned combinations thereof can be bonded to encapsulate electronics via a borosilicate or high temperature-resistant photoresists or polymers. These can be kept in place provided there are vias. The vias can be openings in the material that can be filled with low resistance contacting materials such as low ohmic resistance metals for electronic/electrical interconnects between electronic features on the bonded wafers. Alternatively, two wafers can be bonded while electronically insulated from each other by insulating silica. Then, image charge methods, optical methods, magnetic current induction and magnetization can be used to transfer the sensor signal changes in voltage, capacitance and/or stored charges to the sensing electronics on the other side of the wafer bonding pairs. In the case of a power source, current induction and image charges can be used. Alternatively, a triply-bonded wafer, such as power sources, electronics and sensors' substrates can be bonded in a triplet set-up, where all the silica-silica polymorphic interphases pairs, and all the silica-silicon polymorphic interphases can be bonded, for example, including but not limited to Silica-Si(100)-Silicon, or silica-silica-silica. There is no reason to limit the stacking of the bonded stacked wafers to three, provided the plasticity of the silicate-based polymorphic interphase is well maintained via hydroxylation of the interphase.
4) Conditions for the bonding process after contacting include temperatures for the annealing/sintering/bonding below about 200° C. where no excessive and sudden (LB) desorption of $O_2H_2Si$ can occur. A Langmuir-Blodgett thin film adsorbate of water radical $(OH)^-$ can be present, confining hydroxyl groups to the one molecular sheet of $(OH-)^-$ bonded to dangling bonds, resulting in the $O_2H_2Si(100)$ self-ordered precursor phase nucleated on (1×1) Si(100). Remnant radicals can be allowed to evaporate during the last stage of the wet chemical process—including OH-based molecules and compounds. Moisture, alcohol, and/or other liquid droplets and adsorbate remnants on top of the hydroxylated Si(100) and silica will decrease the cross-bonding density. Thus, water, alcohol-based remnants and acid-based remnants on the surface should preferably be limited to less 10% by volume or less than 5% by volume or less than 1% by volume according to the performance and lifetime requirements of the devices being bonded, for example, hermetically-sealed sensors electronic or power source/electronics/sensors combination. Lifetime requirements for the electronics, that range from a few months or less than a year of full functionality, can be embodied by a remnant adsorbate of 10% or less. A requirement of a decade of life or more—as in solar cell technology—preferably requires less than 5% adsorbate remnant. Medical implants would require less than 1% adsorbate remnant to create a hermetic and stable enough to match closely the lifetime of the patient (several decades, possibly 100 years). Such well-controlled drying of a wet and chemically-cleaned hydrophobic wafer will result in a (LB) molecular adsorbate of $(OH)^-$ bonded to the silica and Si(100). For devices requiring extended lifetimes (>1 year to decades) and high mechanical strength (>a few $MPa/cm^2$), the interphase bonding density is maximized because wet bonding promotes a rich density of connections of hydroxylated chains up to a plastic network. This feature results in enough plasticity to avoid brittle mechanical breakage upon further thermal annealing of stresses, while avoiding catastrophic water vapor desorption during thermal cycling that can lead to interphase fracture. Mechanical strength of the bonding phase can be maximized by selecting a pair of surfaces on each device having $O_2H_2Si(100)(1\times1)$ and $SiO_x$ with $x\leq2.4$ as the bonding surfaces when patterning has already taken place. By aligning the bonding regions, an optimum saturation of the missing oxygen on the $SiO_x$ can take place by desorbing some of the Hydrogen on the $O_2H_2Si(100)(1\times1)$ or unordered OH—Si(100) and letting the orphaned oxygen react with the $SiO_x$. For example, about 10% of the Hydrogen can be desorbed to react with the Oxygen. One advantage of the bonding inter-phase and its very controlled nucleation and growth is that it can be easily computer-simulated over a large area with terraces and variations in interface "gap" and thus optimized for the number of such bonds by varying $H_2O$ concentration (humidity), during contacting and gasses (air versus pure $O_2$). Optimized temperature can be calculated by a cheap computer simulation rather than complex, onerous experiments. This simulation method is very attractive for expensive or high performance electronics. Varying the bond density in the interphase starting around 10% of cross-bonding, or with one molecule in "bridging" the interface as an interphase and simulating percolations of saline ($H_2O,Na,Cl$—) can be used as an initial clinical trial or device testing prior to actual manufacturing and testing.

Example 3

Wet Nano-Bonding of Silica to Si and Silica to Silica below 200° C. by $H_2O$ catalysis and a 2-D precursor phase: TMAFM, Hydroaffinity and Surface Free Energy Analysis"

Abstract:

Mixed $Si_2(OH)_4/\beta$-cristobalite nano-films about 2.1±0.1 nm in thickness, are nucleated on $OH(1\times1)Si(100)$ as precursor nano-phases to promote direct cross-bonding between silica and Si, and silica to silica surfaces using extended atomic terraces, T≤200° C., an $H_2O/O_2$ ambient and steam pressurization. This approach, called "Wet Nano-Bonding™" uses the Herbots-Atluri (H-A) method [1] to nucleate planarized precursor phases that promotes nano-bonding via direct siloxanes and silica molecular bonds between two surfaces brought into contact at the nano-scale.

The ordered $Si_2(OH)_4/\beta$-cristobalite precursor phase exhibits interfaces with Si(100) and free surfaces with extended atomic terraces that 10-100× wider than the typical 2 nm width of "as received" Si(100) wafers. β-cristobalite precursor phases consist mainly of ordered $SiO_2$ and $Si_2(OH)_4$ phases that desorb at low temperatures (T</~200° C.) [3]. Ordered oxide nano-phases on $OH(1\times1)$-Si(100) can promote the growth of flatter, smoother, better controlled nm-thick oxides at low temperatures in ambient air. When put in close contact at T≥200° C. with oxygen-deficient phases of $SiO_x$ obtained by controlled selective etching of thermal oxides and/or silica substrates used in microelectronics, they can consistently nucleate a cross-bonding oxide between two substrates, resulting in a "nano-bonding" inter-phase [4] between various combinations Si and silica wafers or substrates, provided an $H_2O/O_2$ ambient catalyzes low temperature oxidation and nano-contacting is achieved via steam pressurization in the nano-bonding chamber.

Introduction

Wet Nano-Bonding™ is the catalyzed reaction of cross-bonding molecules that condense into a macroscopically continuous bonding "inter-phase"[ref 9] between 2 smooth surfaces put into mechanical contact. For this to occur, we found that Si(100) surfaces, their native oxides, a- and b-quartz crystalline silicates and other crystalline silica polymorphs need to exhibit wide flat atomic terraces (width >/10 nm), with low atomic step density (<500 steps/μm across atomic terraces direction) and very low particulate density (less than $\frac{1}{100}$ μm$^2$).

The term "wet" identifies the fact that cross-bridging molecular bonding are catalyzed by water vapor, which is also used to compress the two surfaces to be bonded. Steam pressurization in the nano-bonding chamber eliminates wafer/sample macroscopic warp, bow and other macroscopic surface deformations so that the two surfaces are not only in nano-contact, but are brought together in a gentle, slow compression step that eliminates wafer or micro-sample breakage, for any sample geometry. This eliminates mechanically contacting the samples to be bonded via tools that need to match their geometry.

Electro-optical grade amorphous and vitreous silica surfaces lack such terraced features but can exhibit smoother and more planar surfaces than as received Si(100). They do require a well-defined r.m.s roughness around 0.9±0.01 nm with average fluctuations within 10% to achieve good mechanical contact with flat Si(100) surfaces at the nanoscale. Such r.m.s values contrast with typical r.m.s values of >/~0.2±0.4 nm and density of surface steps ~500 steps/μm (a.a.t.d.). Particulate density also has to be controlled to >/~0.1-1 particulates/μm$^2$, which is typically found in as received wafers or post-processing. Wet Nano-Bonding includes therefore 4 steps: (1) cleaning and planarization via particulate removal (2) nucleation of the beta-cristobaliet precursor phase (3) contacting (4) steam pressurization during the Nano-Bonding Anneal. We show in this example via Tapping Mode Atomic Force Microscopy (TMAFM) and 3L SD CAA to extract surface free energy that compared to conventional wet chemical processing, spin-etching is more effective processing to remove particulates and planarize the surface.

In conventional wafer bonding, surface step densities ≥500 step/μm a.a.t.d, typically found on Si(100) with miscuts <0.025° and particulates densities ≥0.1 particulates/μm$^2$ particulates result in three-dimensional isolated bonding sites. The present paper shows that more uniform, two-dimensional inter-phases can grow laterally at rates much larger than across during nano-bonding at temperatures below 180° C. A new wet chemical process combining our H-A chemistry with oxide etching is conducted both in a state-of-the-art single wafer spin-etcher and a new Class 1 customized 16" wafer chemical laminar flow [1,2]. TMAFM analysis is used to measure roughness and topology before and after nano-bonding. Mechanical bond pull tests show nano-bonding can result in bonding strengths larger than 8 MPa/cm$^2$: wafers fracture within the bulk of both Si and silicate substrates rather than exhibit interfacial delamination.

Motivation: Bonding Between Si and $SiO_2$ for Single Device Electronics.

Chemistry of Si and Silicate Substrate Bonding 2-nm thick b-cristobalite can be nucleated on hydroxylated OH-terminated $(1\times1)Si(100)$ by the Herbots-Atluri (H-A) method and forms a smooth, ordered, two-dimensional inter-phase template that desorbs at low temperatures for a silicate phase (T~200° C.) [1-11]. Such ordered silicate nanophases on OH terminated $(1\times1)$-Si(100) can, when in contact with another oxygen-deficient silicate phase, such as SiO2 used in micro- and nano-electronics, drive an interface-mediated chemical reaction between the two substrates in an oxidizing ambient. Interface controlled chemical reactions can in turn nucleate and grow a cross-bonding inter-phase between the two substrates that achieves "nano-bonding" [[12]] between pairs of wafers or substrates of Si and silica. For example, OH-terminated $(1\times1)$ Si(100) wafer surfaces can be bonded to a silicon oxide phase such as thermal $SiO_2$ on Si, or a silica wafer.

Physical Definition of Nano-Bonding

Bonding at the nanoscale or "nano-bonding" means formation of cross-bonding molecules condensing into a continuous macroscopic two-dimensional bonding phase across two surfaces put into direct mechanical contact.

An important application for nano-bonding is the creation of hermetic interfaces where percolation of liquids and in particular corrosive fluids or gasses is prevented. An example of a direct application of nano-bonding is single device sensors with their own source and/or radio-emitter. Two of the most common applications are atmospheric sensors to be submerged in sea-water [13] or pollutant-laden clouds, and single-device human implants for continuous monitoring of glucose [12], blood pressure or alpha-protein markers for various cancers [12] In both atmospheric and medical applications, the interface between the sensor's substrate (which can be either silica or Si) and the supporting detection/emission electronics and power supplies has to be hermetically sealed from percolation of saline solutions [14-21].

The purpose of nano-bonding is to yield hermetically bonded wafers or single device hybrids whose bonding interface is sealed to corrosive fluid percolation. The impermeability and hermeticity of the silicate nano-bonding inter-phase is needed to make hybrid single devices made from Si and silicates substrates compatible with continuous immersion in corrosive saline solutions. This includes sea-water or body fluids for durations extending from a few weeks to decades. In other words, the surfaces to be nano-bonded should make cross-bridging phase domains that minimizes atomic, ionic and molecular diffusion and liquid percolation over extended durations.

Crystalline substrates, whether Si or a silica polymorph, therefore need to exhibit "wide" atomic terraces (width $>/=10$ nm), with low atomic step density (<500 steps/µm across atomic terraces directions) and very low particulate density (less than $10^{-2}$ particulate/µm$^2$). These three features are unlike the typical density of surface steps (~500 steps/µm across atomic terraces direction) and the expected particulate density ($>/\sim 0.1$-1 µm$^{-2}$) found in as-received wafers or post-wafer processing. Step densities $\geq 500$ step/µm across atomic terraces direction, are typically found on Si substrates with mis-cuts ~0.025°. Particulates densities are typically $\geq 0.1$ particulates/µm$^2$ in back-end processing where sensors are bonded to Si substrates supporting electronics, signal emitters and power sources. In such clean-room and manufacturing conditions, wafer bonding occurs via isolated points of contacts. Thus, a three-dimensional, porous bonding phase is formed. In contrast, nano-bonding leads to a more continuous, hermetic two-dimensional inter-phase that grows over more than hundreds of inter-atomic distances along the geometric interface as well as a few interatomic distances bridging between the two wafer surgaces. This results in an aspect ratio of 10:1 for the two-dimensional nano-film phase. This approach is called nano-bonding, and the bonding phase an interphase.

Bonding of substrates surfaces smoothed at the nano-scale with low particulate densities can result in a bonding strength larger than 8 MPa/cm$^2$, as measured by mechanical bond pull tests. At such bonding strengths, wafer breakage within the bulk of both Si and silicate substrates is observed before interface delamination ever takes place.

[1] V. Atluri, N. Herbots, D. Dagel, H. Jacobsson, M. Johnson, R. Carpio, B. Fowler, "*Science & Technology of Semiconductor Surface Preparation*", eds by G. S. Hagashi, M. Hirose, S. Ragahavan, et al. (MRS Symp. Proc. Vol 477, Pittsburgh, Pa. 1997)

[2] Herbots, N., Shaw, J. M., Hurst, Q. B., Grams, M. P., Culbertson, R. J., Smith, D. J., Atluri, V., Zimmerman, P. & Queeney, K. T. Mater. Sc. & Eng, B87 (2001), 303-316.

[3] N. Herbots, V. Atluri, J. D. Bradley et al., U.S. Pat. No. 6,613,617 (2003)

[4] Queeney et al., Infrared spectroscopic analysis of an ordered Si/SiO2 interface, Appl. Phys. Lett., Vol. 84, No. 4, pp. 26-29 (2004)

[5] N. Herbots, V. Atluri, Q. B. Hurst, J. M. Shaw, et al. Mater. Res. Soc. Symp. Proc. Vol. 5 . . . , Pittsburgh, Pa. 1998)

[6] V. Atluri, PhD Thesis, Arizona State University (1999)

[7] J. M. Shaw, PhD Thesis, Arizona State University (2006)

[8] Shaw, J. M.; Herbots, N.; Hurst, Q. B.; Bradley, D.; Culbertson, R. J.; Atluri, V.; Queeney, K. T. (2006). Journal of Applied Physics. Vol 100. No 10 (2006) pp. 104-109

[9] U.S. Pat. No. 7,851,365 issued Dec. 14, 2010, "Methods for preparing semiconductor substrates & interfacial oxides there on" Herbots, Bradley, Shaw, Culbertson and Atluri

[10] J. D. Bradley, "A new heteroepitaxial SiO$_2$ nanophase on OH(1×1)Si(100) identified via 3.05 MeV ion channeling & 3-D MultiString, Arizona State University, PhD (2006)

[11] J. D. Bradley, N. Herbots, R. J. Culbertson, J. M. Shaw, V. Atluri. *Characterization of Oxide/Semiconductor Interfaces for CMOS Technologies*, eds Y. Chabal, A. Estève, N. Richard, G. Wilk (Mater. Res. Soc. Symp. Proc. Volume 996E, Warrendale, Pa., (2007)

[12] US patent Filed Apr. 30, 2009, "Low Temperature *Wafer Bonding including a cross-bonding nano-interphase (SILOXSI)*. N. Herbots, R. J. Culbertson, J. D. Bradley, M. A. Hart, D. A. Sell and S. D. Whaley

[13] N. Herbots, Technology Disclosure filed Jun. 6, 2011. "Smart Sea-sensors for underwater applications and Smart Rocks/Smart Sands for dry land monitoring"

[14] Arnold, M. A., *The Journal of Regenerative Medicine*, 1(5) (2000), 55-58.

[15] Carlson, R. E., Silverman, S. R., Mejia, Z. "Development of an Implantable Glucose Sensor", retr. on Feb. 3, 2008, web site verichipcorp.com/files/GLUwhiteFINAL.pd

[16] Baldus H., Klabunde K., Müsch G. *European Workshop on Wireless Sensor Networks (EWSN)*, LNCS 2920 (2004), 353-363

[17] Dai, B., Urbas, A., Lodder, R. A. *NIR News*. (2006). 17 (1), 14-15.

[18] Frost, M., Meyerhoff, M., *Current Opinion in Chemical Biology*, 6 (2002) p. 633-641.

[19] Patet-Predd, P. "*Technology Review*, (2006)

[20] Akers, J., Setter, S. M., *Pharmacy Times* (2007). Ret. Feb. 4, 2008, web site pharmacytimes.com/issues/articles/2007-05_4633.asp, *Medical Devices & Surgical Technology Week* (2006). 335.

[21] Frost, M. C., Meyerhoff, M. E., *Analytical Chemistry*, 79 (2006) p. 7370-7377.

The present invention is illustrated by way of the foregoing description and examples. The foregoing description is intended as a non-limiting illustration, since many variations will become apparent to those skilled in the art in view thereof. It is intended that all such variations within the scope and spirit of the appended claims be embraced thereby. Each referenced document herein is incorporated by reference in its entirety for all purposes.

Changes can be made in the composition, operation and arrangement of the method of the present invention described herein without departing from the concept and scope of the invention as defined in the following claims.

We claim:

1. A method for bonding substrates comprising
   contacting a first bonding surface of a first substrate with a second bonding surface of a second substrate in a vessel; and
   introducing steam into the vessel to form an assembly of the first substrate and the second substrate in a pressurized atmosphere comprising steam and oxygen, wherein the pressurized atmosphere has a relative humidity above 80% and a temperature between about 25° C. and about 200° C., to form a hydroxylated cross-bridging interphase that binds the first bonding surface and the second bonding surface;
   wherein no mechanical compression is applied to the assembly;
   wherein the pressurized atmosphere has a pressure between about 1 atm and about 1.1 atm;
   wherein the first bonding surface comprises a polarized surface layer;
   wherein the second bonding surface comprises a hydrophilic surface layer; and
   wherein the first bonding surface and the second bonding surface are different.

2. The method of claim 1, wherein the first substrate and the second substrate each independently comprises (i) a group IV element, a IV-IV multi-element semiconductor or a IV-IV-IV multi-element semiconductor;
(ii) a polymorphic phase, oxide, nitride, oxynitride, carbide, oxycarbide, oxynitrocarbide, or hydride of a group IV element, or a IV-IV multi-element semiconductor, or a IV-IV-IV multi-element semiconductor;
(iii) Al, $Al_2O_3$, Ti, $TiO_2$, or any oxide, nitride, oxynitride, carbide, oxycarbide, and oxynitrocarbide of Ti, TiW, Nb, Ta, Zr, Er, or La, or mixtures thereof, or a peroskvite compound used in refractory MOS gates; or
(iv) a group II-V or III-VI or tertiary alloys thereof.

3. The method of claim 2, wherein the first substrate and the second substrate each independently comprises Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_yN_{1-x})_n$, $(Si_{1-x-y}Ge_xC_y)_3N_{4-x-y}$, $SiO_2$, $GeO_2$, $Si_xGe_{1-x}O_2$, $Si_{1-x-y}Ge_{x-}C_yO_2$, $Ge_xC_{1-x}O_2$, $Si_3N_4$, $Si_{1-x-y}Ge_xSn_yC_z$, $Ge_xC_{1-x}$, SiGe, SiGe oxide, SiN, Sic, Al, $Al_2O_3$ or $Si_{3(1-x)}Ge_{3x}N_{4(1-\delta)}$.

4. The method of claim 2, wherein the first substrate and the second substrate each independently comprises $TiO_2$, or any oxide, nitride, oxynitride, carbide, oxycarbide, and oxynitrocarbide of Ti, TiW, Nb, Ta, Zr, Er, or La, or mixtures thereof.

5. The method of claim 2, wherein the first substrate and second substrate each independently comprises BN, BP, BAs, BSb, BBi, AlN, AlP, AlAs, AlSb, AlBi, GaN, GaP, GaAs, GaSb, GaBi, InN, InP, InAs, InSb, InBi, TlN, TlP, TlAs, TlSb, TlBi, CdSe, CdS, CdTe, ZnO, ZnSe, ZnS, ZnTe, $Be_xZn_{1-x}Se$ (where x is greater than 0 and less than 1 (e.g., $Be_{0.45}Zn_{0.55}Se$)), CdZnTe (CZT), HgCdTe or HgZnTe.

6. The method of claim 2, wherein one or more of the group IV element, IV-IV multi-element semiconductor, IV-IV-IV multi-element semiconductor, group II-V alloy, group III-VI alloy or tertiary alloy is doped.

7. The method of claim 2, wherein any of (i)-(iii) has a hydroxylated-terminated surface.

8. The method of claim 2, wherein any of (i)-(iii) has a hydride-terminated surface.

9. The method of claim 1, wherein the first substrate and the second substrate are each wafers or beads.

10. The method of claim 1, wherein the atmosphere is water saturated air.

11. The method of claim 1, wherein the contacting is maintained for up to 2 hours.

12. The method of claim 1, wherein the hydroxylated cross-bridging interface has a bonding strength of between about 8 MPa and about 12 MPa.

13. The method of claim 1, wherein the first substrate is a Si wafer and the second substrate is a silicate wafer.

14. The method of claim 13, wherein the first bonding surface is $O_2H_2Si(1\times1)(100)$ and is formed by cleaning the Si wafer with the Herbots-Atluri clean.

15. The method of claim 13, wherein the second bonding surface is formed by chemical etching followed by chemical oxidation of the silicate wafer.

16. The method of claim 13, wherein the hydroxylated cross-bridging interface consists essentially of silicon, oxygen, and hydrogen.

17. The method of claim 1, wherein the first substrate is a Si wafer and the first bonding surface is $O_2H_2Si(1\times1)(100)$.

18. The method of claim 1, wherein the second substrate is a silicate wafer and the second bonding surface is $SiO_x$, where $0<x\leq2$.

19. The method of claim 1, wherein the first bonding surface comprises a hydroxy-terminated silicate.

20. The method of claim 1, wherein the first substrate and the second substrate are both silicate wafers, and the first bonding surface comprises hydroxyl-terminated silicate; and second bonding surface comprises $SiO_x$, where $0<x\leq2$.

21. The method of claim 1, wherein the first bonding surface comprises $O_2H_2Si(1\times1)(100)$ or hydroxy-terminated $SiO_2$ surface ($SiO_2$—$O_2H_2Si$) wherein about 5% to about 90% Hydrogen has been desorbed from the first bonding surface; and
the second bonding surface comprises $SiO_x$, where $0<x\leq2$.

22. The method of claim 1 wherein
the first bonding surface comprises $O_2H_2Si(1\times1)(100)$; and
the second bonding surface comprises a silicate.

23. The method of claim 22, wherein the second bonding surface comprises $SiO_x$, where $0<x\leq2$.

24. The method of claim 1 wherein
the first bonding surface comprises hydroxy-terminated silica; and
the second bonding surface comprises $SiO_x$, where $0<x\leq2.4$.

25. The method of claim 1, wherein the hydroxylated cross-bridging interphase comprises Si and $O_2$, with H-doping and OxHy-termination.

26. The method of claim 1, wherein the vessel has an outer diameter of about 5.5 inches, and wherein the vessel has an outer height of about 1.375 inches.

27. The method of claim 1, wherein the vessel defines a chamber inside the vessel, and wherein the chamber of the vessel includes an elastomeric liner.

28. The method of claim 27, wherein the vessel further comprises a ring seal positioned between the upper component and the lower component.

29. The method of claim 27, wherein the steam is introduced through the inlet of the vessel into the chamber at a flow rate in the range of about 0.002 L/min to about 0.2 L/min.

30. The method of claim 1, wherein the vessel defines a chamber inside the vessel, wherein the chamber has an inner diameter of about 3.5 inches, and wherein the chamber has an inner height of about 0.375 inches.

31. The method of claim 1, wherein the vessel comprises
an upper component;
a lower component;
a connection mechanism to couple the upper component to the lower component, wherein the upper component and the lower component define a chamber when coupled together;
an inlet in fluid communication with the chamber; and
a pressure relief valve in fluid communication with the chamber.

32. The method of claim 1, further comprising contacting a third bonding surface of a third substrate with a fourth bonding surface of the second substrate in the vessel to form a three substrate assembly in the pressurized atmosphere.

* * * * *